US008192918B2

(12) United States Patent
Loccufier et al.

(10) Patent No.: US 8,192,918 B2
(45) Date of Patent: Jun. 5, 2012

(54) LITHOGRAPHIC PRINTING PLATE PRECURSOR

(75) Inventors: Johan Loccufier, Zwijnaarde (BE); Philippe Moriame, Antwerp (BE); Stefaan Lingier, Assenede (BE)

(73) Assignee: Agfa Graphics NV, Mortsel (BE)

( * ) Notice: Subject to any disclaimer, the term of this patent is extended or adjusted under 35 U.S.C. 154(b) by 339 days.

(21) Appl. No.: 12/532,227

(22) PCT Filed: Apr. 22, 2008

(86) PCT No.: PCT/EP2008/054842

§ 371 (c)(1),
(2), (4) Date: Sep. 21, 2009

(87) PCT Pub. No.: WO2008/132091

PCT Pub. Date: Nov. 6, 2008

(65) Prior Publication Data

US 2010/0112476 A1 May 6, 2010

Related U.S. Application Data

(60) Provisional application No. 60/914,409, filed on Apr. 27, 2007.

(30) Foreign Application Priority Data

Apr. 27, 2007 (EP) .................................... 07107135

(51) Int. Cl.
*G03F 7/00* (2006.01)
*G03F 7/09* (2006.01)

(52) U.S. Cl. .................... 430/271.1; 430/270.1; 101/453

(58) Field of Classification Search ............... 430/270.1, 430/271.1, 275.1, 278.1, 300, 302; 101/453, 101/463.1
See application file for complete search history.

(56) References Cited

U.S. PATENT DOCUMENTS

| | | | | | |
|---|---|---|---|---|---|
| 3,850,633 | A * | 11/1974 | Moraw et al. | 430/1 |
| 3,929,488 | A | 12/1975 | Smith | |
| 5,340,699 | A * | 8/1994 | Haley et al. | 430/302 |
| 5,491,046 | A * | 2/1996 | DeBoer et al. | 430/302 |
| 5,582,952 | A * | 12/1996 | Kawamura et al. | 430/166 |
| 6,143,464 | A | 11/2000 | Kawauchi | |
| 6,190,825 | B1 | 2/2001 | Denzinger et al. | |
| 6,936,384 | B2 * | 8/2005 | Munnelly et al. | 430/17 |
| 7,621,350 | B2 | 11/2009 | Richert | |

FOREIGN PATENT DOCUMENTS

| | | | |
|---|---|---|---|
| EP | 0 864 420 | A1 | 9/1998 |
| EP | 0 909 657 | A2 | 4/1999 |
| EP | 0 933 682 | A2 | 8/1999 |
| EP | 0 934 822 | A1 | 8/1999 |
| EP | 1 072 432 | A2 | 1/2001 |
| EP | 1 120 246 | A2 | 8/2001 |
| EP | 1 211 065 | A2 | 6/2002 |
| EP | 0 887 182 | B1 | 7/2002 |
| EP | 1 241 003 | A2 | 9/2002 |
| EP | 1 275 498 | A2 | 1/2003 |
| EP | 1 291 172 | A2 | 3/2003 |
| EP | 1 433 594 | A2 | 6/2004 |
| EP | 1 268 660 | B1 | 7/2004 |
| EP | 1 439 058 | A2 | 7/2004 |
| EP | 1 311 394 | B1 | 12/2004 |
| EP | 1 262 318 | B1 | 3/2005 |
| EP | 1 263 590 | B1 | 3/2005 |
| EP | 1 011 970 | B1 | 2/2006 |
| EP | 1 299 238 | B1 | 2/2007 |
| EP | 1 368 413 | B1 | 7/2008 |
| WO | WO 99/01795 | A2 | 1/1999 |
| WO | WO 99/63407 | A1 | 12/1999 |
| WO | WO 01/09682 | A2 | 2/2001 |
| WO | WO 01/96119 | A1 | 12/2001 |
| WO | WO 02/053626 | A1 | 7/2002 |
| WO | WO 02/053627 | A1 | 7/2002 |
| WO | WO 03/074287 | A1 | 9/2003 |
| WO | WO 2004/020484 | A1 | 3/2004 |
| WO | WO 2004/033206 | A1 | 4/2004 |
| WO | WO 2008/073310 | A1 | 6/2008 |
| WO | WO 2008/083448 | A1 | 7/2008 |
| WO | WO 2008/089038 | A1 | 7/2008 |

* cited by examiner

*Primary Examiner* — Anca Eoff
(74) *Attorney, Agent, or Firm* — Leydig, Voit & Mayer, Ltd.

(57) ABSTRACT

A lithographic printing plate precursor is disclosed which comprises a support having a hydrophilic surface or which is provided with a hydrophilic layer, and a coating thereon, said coating comprising an IR absorbing agent and a contrast enhancing compound, characterized in that said contrast enhancing compound has the structure of formula (I). The printing plate comprising the contrast enhancing compound improves the thermoresponsivity of the coating and is capable of improving the resistance of the coating in the non-exposed areas against the alkaline developer.

(I)

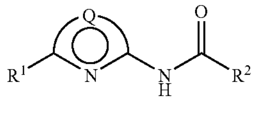

10 Claims, No Drawings

LITHOGRAPHIC PRINTING PLATE PRECURSOR

FIELD OF THE INVENTION

The present invention relates to a lithographic printing plate precursor comprising a contrast enhancing compound having the structure of formula I. The present invention relates also to a method of making a lithographic printing plate whereby excellent printing properties are obtained and whereby the developing latitude or exposure latitude are improved.

BACKGROUND OF THE INVENTION

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. A typical positive-working plate precursor comprises a hydrophilic support and an oleophilic coating which is not readily soluble in an aqueous alkaline developer in the non-exposed state and becomes soluble in the developer after exposure to radiation. In addition to the well known photosensitive imaging materials which are suitable for UV contact exposure through a film mask (the so-called pre-sensitized plates), also heat-sensitive printing plate precursors have become very popular. Such thermal materials offer the advantage of daylight stability and are especially used in the so-called computer-to-plate method (CtP) wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer or by particle coagulation of a thermoplastic polymer latex, and solubilization by the destruction of intermolecular interactions or by increasing the penetrability of a development barrier layer.

Although some of these thermal processes enable platemaking without wet processing, the most popular thermal plates form an image by a heat-induced solubility difference in an alkaline is developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support.

Typically, for a positive-working thermal plate, a dissolution inhibitor is added to a phenolic resin as binder whereby the rate of dissolution of the coating is reduced. Upon heating, this reduced rate of dissolution of the coating is increased on the exposed areas compared with the non-exposed areas, resulting in a sufficient difference in solubility of the coating after image-wise recording by heat or IR-radiation. Many different dissolution inhibitors are known and disclosed in the literature, such as organic compounds having an aromatic group and a hydrogen bonding site or polymers or surfactants comprising siloxane or fluoroalkyl units.

The known heat-sensitive printing plate precursors typically comprise a hydrophilic support and a coating which is alkali-soluble in exposed areas (positive working material) or in non-exposed areas (negative working material) and an IR-absorbing compound. Such coating typically comprises an oleophilic polymer which may be a phenolic resin such as novolac, resol or a polyvinylphenolic resin. However, these plates suffer on a lack for resistance against press chemicals and the printing run length of these plates needs to be improved.

Therefore, in order to improve the printing run length, the phenolic resin is chemically modified whereby the phenolic monomeric unit is substituted by a group such as described in WO99/01795, EP 934 822, EP 1 072 432, U.S. Pat. No. 3,929,488, EP 2 102 443, EP 2 102 444, EP 2 102 445, EP 2 102 446. The phenolic resin can also been mixed with other polymers such as an acidic polyvinyl acetal as described in WO2004/020484 or a copolymer comprising sulfonamide groups as described in U.S. Pat. No. 6,143,464 or other polymeric binders as described in WO2001/09682, EP 933 682, WO99/63407, WO2002/53626, EP 1 433 594 and EP 1 439 058. However, as a result of these modifications of the phenolic resin or the addition of other binders to the phenolic resin, the quality of printing plates is usually reduced, e.g. a reduced sensitivity of the plate on image-wise exposing or a reduced developing latitude. This means that the difference between the rate of dissolution of the exposed areas and the non-exposed areas is reduced. This may result in an insufficiently removal of the coating at the exposed areas, i.e. an insufficient clean-out of the plate, and, as a result, toning may occur on the press. In another possibility, this reduced difference may also result in a reduced coating thickness of the coating at the non-exposed areas resulting in a reduced printing performance such as a reduced ink acceptance of the printing areas or a reduced printing run length.

Also, positive-working printing plates are described in the prior art which comprise other polymeric binders, usually alkali soluble resins, in an intermediate layer between the heat-sensitive recording layer and the support. In these plates, the heat-sensitive coating together with the intermediate layer are removed at the exposed areas and printing plates can be obtained having an improved clean-out and an improved chemical resistance against press chemicals and printing run length. Typical examples of positive-working thermal plate materials having such a two layer structure are described in e.g. EP 864420, EP 909657, EP-A 1011970, EP-A 1263590, EP-A 1268660, EP-A 1072432, EP-A 1120246, EP-A 1303399, EP-A 1311394, EP-A 1211065, EP-A 1368413, EP-A 1241003, EP-A 1299238, EP-A 1262318, EP-A 1275498, EP-A 1291172, WO2003/74287, WO2004/33206, EP-A 1433594 and EP-A 1439058. However, these plates of the prior art suffer on undercutting, i.e. partially dissolving of the intermediate layer at the non-exposed areas, especially at the edges of the printing areas due to the poor resistance of the intermediate layer for the alkaline developer. As a result of this undercutting, it is difficult to form highly sharp and clear images, particularly highlights, i.e. fine images comprising a dot pattern or fine lines are difficult to be reproduced.

In a high quality plate it is advantageous that such highlights can be reproduced within a sufficient developing latitude, i.e. small fluctuations in developing time and temperature and in developer conductivity do not substantially affect the image formed on the plate and this developing latitude is obtained when the difference in dissolution rate is improved. Therefore, the inventors of the present invention found a new compound which is capable of improving the lithographic differentiation between the exposed and non-exposed printing areas and an improved clean-out at the exposed areas and a high alkaline resistance at the non-exposed areas.

WO 2002/53626 and WO 2002/53627 disclose an imageable element comprising a thermally sensitive supramolecular polymer which exhibits an increased solubility in an aqueous developer solution upon heating.

SUMMARY OF THE INVENTION

It is therefore an aspect of the present invention to provide a heat-sensitive lithographic printing plate precursor whereby an improved lithographic differentiation between the exposed and non-exposed printing areas and an improved clean-out at the exposed areas and a high alkaline resistance at the non-exposed areas is obtained. This object is realized by the precursor defined in claim 1, having the characteristic feature that the coating on the support comprises a contrast enhancing compound having the structure of formula I. This compound, hereinafter also referred to as "contrast enhancer" or "enhancer" or "CEC", is capable of improving the resistance of the coating in the non-exposed areas against the alkaline developer. This compound is also capable of improving the thermoresponsivity of the coating. This thermoresponsivity means that the difference in dissolution rate of the coating at the exposed and non-exposed areas is improved. This improved thermoresponsivity may also result in an improving of the developing latitude.

Other specific embodiments of the invention are defined in the dependent claims.

DETAILED DESCRIPTION OF THE INVENTION

In accordance with the present invention, there is provided a lithographic printing plate precursor comprising a support having a hydrophilic surface or which is provided with a hydrophilic layer, and a coating thereon, said coating comprising an IR absorbing agent and a contrast enhancing compound, characterized in that said contrast enhancing compound has the structure of formula I (Formula I)

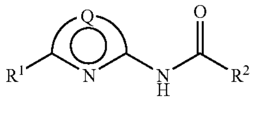

wherein $R^1$ represents a hydrogen, an optionally substituted alkyl, alkenyl, alkynyl, aryl, alkaryl, aralkyl or heteroaryl group, halogen, $—NR^4R^5$, $—CO—NR^4R^5$, $—SO_2—NR^4R^5$, $—COR^6$, $—CN$, $—NO_2$, $—COOR^6$, $—OR^3$, $—SR^3$, $—SOR^3$, $—SO_2R^6$, $—SO_3R^6$, $—PO_4R^4R^5$, $—PO_3R^4R^5$, $—NR^6—CO—NR^4R^5$, $—O—COOR^6$, $—NR^4—COOR^5$, $—NR^4—CO—R^5$ or a phosphoramidate group;

$R^2$ represents a hydrogen, an optionally substituted alkyl, alkenyl, alkynyl, aryl, alkaryl, aralkyl or heteroaryl group, halogen, $—SO_2—NR^4R^5$, $—CN$, $—NO_2$, $—SOR^3$, $—SO_2R^6$, $—SO_3R^6$, $—PO_4R^4R^5$, $—PO_3R^4R^5$ or a phosphoramidate group;

$R^3$ represents an optionally substituted alkyl, alkenyl, alkynyl, aryl, alkaryl, aralkyl or heteroaryl group;

$R^4$, $R^5$ and $R^6$ independently represent a hydrogen or one of the groups as defined for $R^3$, or wherein two groups selected from $R^4$, $R^5$ and $R^6$ together represent the necessary atoms to form a ring;

Q represents one of the following groups to form an optionally substituted 6 membered heteroaromatic ring, said groups selected from $**—C(T^2)\text{-}N—N—*$, $**—N—N—C(T^2)\text{-}*$, $**—N—C(T^2)\text{-}C(T^3)\text{-}*$, $**—C(T^2)\text{-}N—C(T^3)\text{-}*$, $**—C(T^2)\text{-}C(T^3)\text{-}C(T^4)\text{-}*$, $**—C(T^2)\text{-}C(T^1)\text{-}N—*$, $**—N—C(T^1)\text{-}N—*$ or $**—N—N—N—*$, or Q represents one of the following groups to form an optionally substituted 5 membered heteroaromatic ring, said groups selected from $**—C(T^1)\text{-}N(T^2)\text{-}*$, $**—C(T^2)\text{-}S—*$, $**—C(T^2)\text{-}O—*$, $**—N—N(T2)\text{-}*$, $**—N—S—*$, $**—N—O—*$, $**—N(T^2)\text{-}C(T^3)\text{-}*$, $**—S—N—*$ or $**—O—N—*$, wherein

* indicates the binding site to the carbon atom between the two nitrogen atoms and ** indicates the binding site to the carbon atom substituted by $R^1$;

the symbol "O" in the middle of the ring comprising Q represents the pi-electrons necessary for the aromatic ring;

$T^1$ represents one of the groups as defined for $R^1$;

$T^2$, $T^3$ and $T^4$ independently represent one of the groups as defined for $R^2$; or wherein one of the groups of $T^1$, $T^2$, $T^3$ or $T^4$ together with one of the groups of $R^1$ comprise the necessary atoms to form a ring; or wherein one of the groups of $T^1$, $T^2$, $T^3$ or $T^4$ together with one of the groups of $R^2$ comprise the necessary atoms to form a ring; or wherein two groups, selected from $T^1$, $T^2$, $T^3$ or $T^4$, comprise the necessary atoms to form a ring.

In accordance with a preferred embodiment of the present invention, said contrast enhancing compound has the structure of formula II (Formula II)

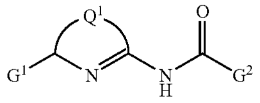

wherein $G^1$ represent one of the groups as defined in formula I for $R^1$;

$G^2$ represent one of the groups as defined in formula I for $R^2$;

$Q^1$ represents one of the following groups to form an optionally substituted 6 membered heteroaromatic ring, said groups selected from $**{=}C(T^2)\text{-}N{=}N—*$, $**{=}N—N{=}C(T^2)\text{-}*$, $**{=}N—C(T^2){=}C(T^3)\text{-}*$, $**{=}C(T^2)\text{-}N{=}C(T^3)\text{-}*$, $**{=}C(T^2)\text{-}C(T^3){=}C(T^4)\text{-}*$, $**{=}C(T^2)\text{-}C(T^1){=}N—*$, $**{=}N—C(T^1){=}N—*$ or $*{=}N—N{=}N—*$, or $Q^1$ represents one of the following groups to form an optionally substituted 5 membered heteroaromatic ring, said groups selected from $**{=}C(T^1)\text{-}N(T^2)\text{-}*$, $**C(T^2)\text{-}*$, $**{=}C(T^2)\text{-}O—*$, $**{=}N—N(T^2)\text{-}*$, $**{=}N—S—*$ or $**{=}N—O—*$;

wherein

* indicates the binding site to the carbon atom between the two nitrogen atoms and ** indicates the binding site to the carbon atom substituted by $R^1$; and $T^1$, $T^2$, $T^3$ and $T^4$ independently represent one of the groups as defined in formula I for $T^1$, $T^2$, $T^3$ and $T^4$ respectively; or wherein one of the groups of $T^1$, $T^2$, $T^3$ or $T^4$ together with one of the groups of $G^1$ comprise the necessary atoms to form a ring; or wherein one of the groups of $T^1$, $T^2$, $T^3$ or $T^4$ together with one of the groups of $G^2$ comprise the necessary atoms to form a ring; or wherein two groups, selected from $T^1$, $T^2$, $T^3$ or $T^4$, comprise the necessary atoms to form a ring.

In another preferred embodiment, the 5- or 6-membered heteroaromatic group partially formed by Q in formula I or $Q^1$ in formula II, is an heterocyclic group derived of a pyridine, a quinoline, an isoquinoline, a pyrimidine, a pyrazine, a 1,3,5-triazine, a 1,2,4-triazine, an imidazole, a benzimidazole, a 1,2,4-triazole, a thiazole, a benzthiazole, an oxazole or a benzoxazole, wherein a N-atom in the aromatic ring comprises two neighbouring C-atoms, one of these C-atoms being substituted by the group —NH—CO—$R^2$ as defined in formula I or the group —NH—CO-$G^2$ as defined in formula II and the other C-atom being substituted by $R^1$ as defined in formula I or $G^1$ as defined in formula II.

In accordance with a preferred embodiment of the present invention, said contrast enhancing compound has the structure of formula III (Formula III)

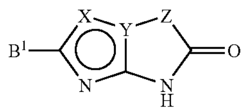

wherein

Y represents a nitrogen atom or a carbon atom;

X represents the necessary atoms to form an optionally substituted five or six membered heteroaromatic ring;

Z represents the necessary atoms to form an optionally substituted five to eight membered ring, preferably a 5- or 6-membered ring, more preferably a 6-membered ring;

$B^1$ represents one of the groups as defined in formula I for $R^1$; and the symbol "O" in the middle of the ring comprising X and Y represents a number of pi-electrons necessary for the aromatic ring.

In accordance with another preferred embodiment of the present invention, said contrast enhancing compound has the structure of formula IV (Formula IV)

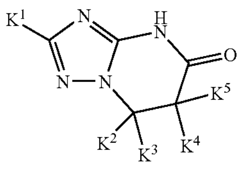

wherein $K^1$ represents one of the groups as defined in formula I for $R^1$; and $K^2$ to $K^5$ independently represents a hydrogen, —$NR^4R^5$, —CO—$NR^4R^5$, —$COR^6$, —$COOR^6$, —$OR^3$, —$NR^6$—CO—$NR^4R^5$, —$NR^4$—CO—$R^5$ wherein $R^3$, $R^4$, $R^5$ and $R^6$ represent the groups as defined in formula I for $R^3$, $R^4$, $R^5$ and $R^6$; or wherein two groups, selected of $K^2$, $K^3$, $K^4$ and $K^5$, together represent the necessary atoms to form a ring.

In accordance with another preferred embodiment of the present invention, said contrast enhancing compound has the structure of formula V (Formula V)

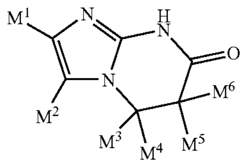

wherein $M^1$ represents one of the groups as defined in formula I for $R^1$; and $M^2$ to $M^6$ independently represents a hydrogen, —$NR^4R^5$, —CO—$NR^4R^5$, —$COR^6$, —$COOR^6$, —$OR^3$, —$NR^6$—CO—$NR^4R^5$, —$NR^4$—$COOR^5$, —$NR^4$—CO—$R^5$ wherein $R^3$, $R^4$, $R^5$ and $R^6$ represent the groups as defined in formula I for $R^3$, $R^4$, $R^5$ and $R^6$; or wherein $M^1$ and $M^2$ together represent the necessary atoms to form a ring; or wherein two groups, selected of $M^2$ to $M^6$, together represent the necessary atoms to form a ring.

In accordance with another preferred embodiment of the present invention, said contrast enhancing compound has the structure of formula VI (Formula VI)

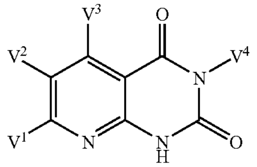

wherein $V^1$ represents one of the groups as defined in formula I for $R^1$; and $V^2$ and $V^3$ independently represents a hydrogen, —$NR^4R^5$, —CO—$NR^4R^5$, —$COR^6$, —$COOR^5$, —$OR^3$, —$NR^6$—CO—$NR^4R^5$, —$NR^4$—$COOR^5$, —$NR^4$—CO—$R^5$ wherein $R^3$, $R^4$, $R^5$ and $R^6$ represent the groups as defined in formula I for $R^3$, $R^4$, $R^5$ and $R^6$; and $V^4$ represents a hydrogen or one of the groups as defined in formula I for $R^3$; or wherein two groups, selected from $V^1$ to $V^3$, together represent the necessary atoms to form a ring.

These contrast enhancing compounds having the structure of at least one of the formula I to VI as defined above are hereinafter also referred to as "contrast enhancer" or "enhancer" or "CEC", and the contrast enhancing compounds of the present invention include also the tautomeric forms of each of these compounds.

The compounds, wherein the groups $R^1$ of formula I, $G^1$ of formula II, $B^1$ of formula III, $K^1$ of formula IV, $M^1$ of formula V and $V^1$ of formula VI are represented by —OH or =O, do not belong to the present invention. These compounds do not exhibit the effect as expected in the present invention as illustrated in the comparative example 8. Such compounds are disclosed in WO 2002/53626 and WO 2002/53627 and these compounds, disclosed in WO 2002/53626 and WO 2002/53627, are disclaimed in the present invention.

Specific examples of said contrast enhancing compounds according to the present invention are given below, without being limited thereto.
CEC-01:
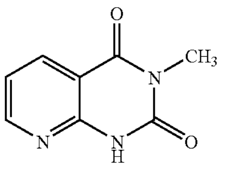
CEC-02:
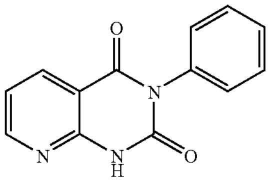
CEC-03:
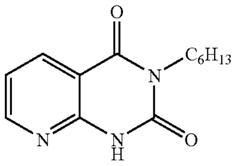
CEC-04:
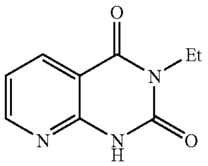
CEC-05:
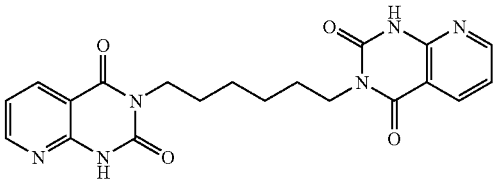
CEC-06:
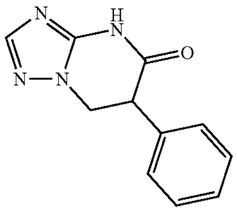
CEC-07:
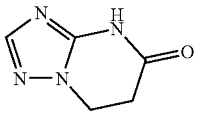
CEC-08:
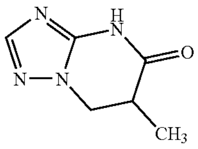
-continued
CEC-09:
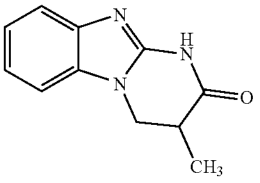
CEC-10:
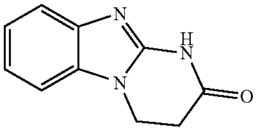
CEC-11:
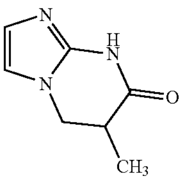
CEC-12:
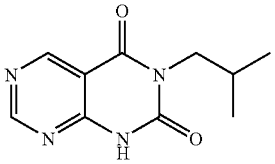
CEC-13:
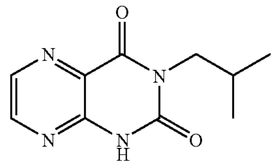
CEC-14:
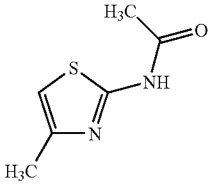
CEC-15:
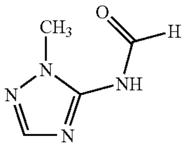
CEC-16:
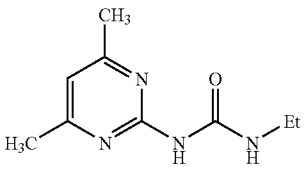

-continued

CEC-17:

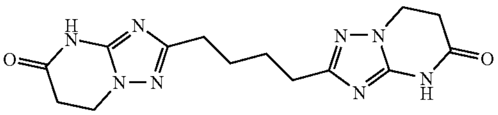

CEC-18:

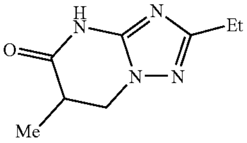

CEC-19:

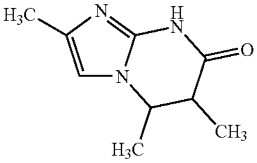

CEC-20:

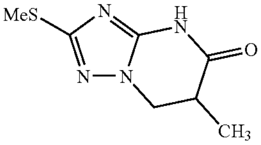

CEC-21:

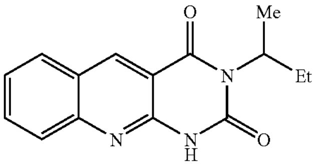

CEC-22:

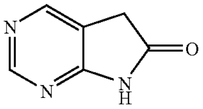

CEC-23:

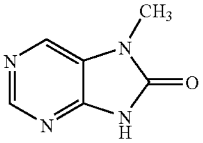

CEC-24:

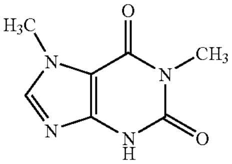

CEC-25:

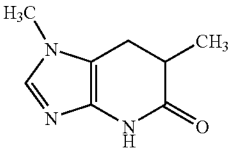

-continued

CEC-26:

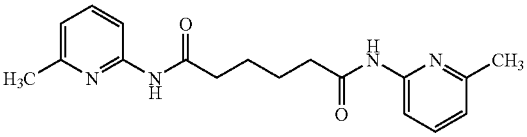

CEC-27:

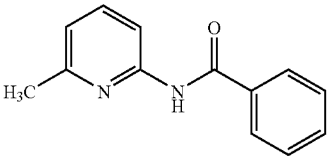

Linking to a Polymer

In another preferred embodiment, said contrast enhancing compound having the structure of formula I as defined above is linked to a polymer by a chemical bound formed between at least one atom of a group, selected from $R^1$, $R^2$ and $T^1$ to $T^4$, and at least one atom of said polymer, preferably said CEC is chemically bound to a side chain of said polymer, optionally by a linking group L between said side chain and said CEC.

In another preferred embodiment, said CEC having the structure of formula II as defined above is linked to a polymer by a chemical bound formed between at least one atom of a group, selected from $G^1$, $G^2$ and $T^1$ to $T^4$, and at least one atom of said polymer, preferably said CEC is chemically bound to a side chain of said polymer, optionally by a linking group L between said side chain and said CEC.

In another preferred embodiment, said CEC having the structure of formula III as defined above is linked to a polymer by a chemical bound formed between at least one atom of a group, selected from $B^1$, X or Z and at least one atom of said polymer, preferably said CEC is chemically bound to a side chain of said polymer, optionally by a linking group L between said side chain and said CEC.

In another preferred embodiment, said CEC having the structure of formula IV as defined above is linked to a polymer by a chemical bound formed between at least one atom of a group, selected from $K^1$ to $K^5$ and at least one atom of said polymer, preferably said CEC is chemically bound to a side chain of said polymer, optionally by a linking group L between said side chain and said CEC.

In another preferred embodiment, said CEC having the structure of formula V as defined above is linked to a polymer by a chemical bound formed between at least one atom of a group, selected from $M^1$ to $M^6$ and at least one atom of said polymer, preferably said CEC is chemically bound to a side chain of said polymer, optionally by a linking group L between said side chain and said CEC.

In another preferred embodiment, said CEC having the structure of formula VI as defined above is linked to a polymer by a chemical bound formed between at least one atom of a group, selected from $V^1$ to $V^4$ and at least one atom of said polymer, preferably said CEC is chemically bound to a side chain of said polymer, optionally by a linking group L between said side chain and said CEC.

The linking group L can be a bivalent, trivalent or tetravalent group, preferably the linking group is a bivalent group. The linking group L can be selected from an optionally substituted alkylene group such as a $—CR^aR^b—$ group, e.g. methylene, a $—(CR^aR^b)_2—$ group, e.g. ethylene, a $—(CR^aR^b)_3—$ group, e.g. propylene, or a $—(CR^aR^b)_4—$ group, e.g. butylene; an optionally substituted arylene group such as a phenylene group, e.g. $—C_6H_4—$, or a naphthalene group, e.g. —$C_{10}H_6$—; an optionally substituted heterocyclic aromatic compound; —O—; —S—; —SO—; —$SO_2$—; —C(═O)—; —C(═O)—O—; —$NR^c$—; —C(═O)—$NR^c$—; —$SO_2$—$NR^c$—; or a combination of at least two of them, wherein each $R^a$, $R^b$ and $R^c$ independently represent hydrogen, an optionally substituted alkyl or aryl group.

Such a polymer comprising a contrast enhancing compound of the present invention, chemically bound to the polymer, hereinafter also referred to as "CEC-polymer" or "CEC-binder", can be obtained via several routes.

In one method, the polymer can be formed by reaction of a polymer having a reactive group and a CEC having another reactive group, present in at least one of the substituting groups of the structures as defined above, whereby these reactive groups are capable of reacting with each other to form chemical bound, e.g. a first type reactive group which can react with a second type of reactive group. A first type reactive group can be selected from a hydroxyl group, a carboxylic acid group, a carboxylic acid anhydride group, a carboxylic acid chloride group or an epoxy group. A second type reactive group which can react with at least one of the first type reactive groups, can be selected from a hydroxyl group, a carboxylic acid group, a carboxylic acid anhydride group, a carboxylic acid chloride group, an epoxy group, an amino group or an isocyanate group.

In another preferred method, the polymer can be formed by polymerization of a monomer having said contrast enhancing compound chemically bound on the side chain of the monomer, hereinafter this monomer is also referred to as "contrast enhancing monomer" or "CEC-monomer". The CEC can be chemically linked to a monomeric unit by an analogue reaction of a monomer having a reactive group and a contrast enhancing group having another reactive group capable of reacting with the other reactive group. Examples of such monomers comprising a group a reactive group are hydroxy alkyl (meth)acrylate such as hydroxy ethyl (meth)acrylate or hydroxy propyl (meth)acrylate, (meth)acrylic acid, (meth) acrylic acid anhydride, (meth)acrylic acid chloride, isocyanoto alkyl (meth)acrylate such as isocyanoto ethyl (meth) acrylate, glycidyl (meth)acrylate or amino alkyl (meth) acrylate such as amino ethyl (meth)acrylate.

The obtained polymers may comprise these CEC-monomers in combination with other co-monomers by an addition polymerisation reaction, e.g. radical addition reaction of different alfa-beta-ethylenically unsaturated compounds, or by a polycondensation reaction, e.g. formation of ester bounds, urethane bounds or phenol-formaldehyde bounds.

Examples of such alfa-beta-ethylenically unsaturated compounds as co-monomer for a CEC-monomer are (meth) acrylic acid or salts thereof; ester or amide of (meth)acrylic acid such as an optionally substituted alkyl, aryl, alkaryl, aralkyl or heteroaryl group, e.g. methyl (meth)acrylate, ethyl (meth)acrylate, hydroxyl ethyl (meth)acrylate, hydroxyl propyl (meth)acrylate, sulpho ethyl (meth)acrylate, phenyl (meth)acrylate, benzyl (meth)acrylate, N-methyl (meth)acrylamide, N-ethyl (meth)acrylamide, N,N-dimethyl (meth) acrylamide, N,N-diethyl (meth) acrylamide, N-methylol acrylamide; (meth)acrylonitrile; vinylacetate and derivates thereof (optionally modification of vinylacetate group after polymerisation such as hydrolisation to vinylalcohol or acetalisation to vinylacetal or vinylbutyraldehyde; styrene and styrene derivatives such as alpha-methylstyrene, 4-butyl styrene, styrene sulphonic acid; vinyl chloride; vinylidene chloride; vinyl ethers such as vinyl methyl ether, vinyl ethyl ether, vinyl propyl ether, vinyl butyl ether; dienes such as butadiene, isoprene; and itaconic acid.

Examples of CEC-monomers, hereinafter also referred to as "CEC-mon", are

CEC-mon-01:

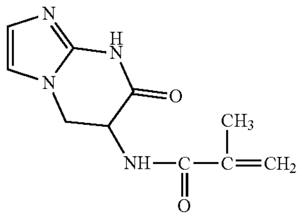

CEC-mon-02:

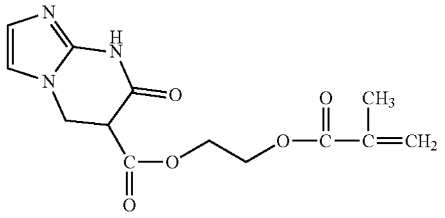

CEC-mon-03:

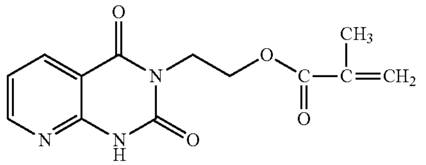

The CEC-mon-01, CEC-mon-02 and CEC-mon-03 are specifically suited to compolymerise with other co-monomers to form a CEC-polymer which can be used in the present invention.

The polymer may be linear or branched and may contain the comonomers distributed ad random. The polymer may also be a block or graft copolymer containing chain segments of a specific monomer, e.g. chain segments of a CEC-monomer. These polymers may contain a CEC-monomer in an amount of preferably at least 1 mol %, more preferably at least 5 mol %, most preferably at least 10 mol %, and the upper limit of the amount incorporated in these polymers is preferably 100 mol %, more preferably at most 95 mol %, most preferably at most 80 mol %.

The CEC-monomers as defined above can also be used in a photopolymerizable composition of the image-recording layer of a lithographic printing plate precursor.

These CEC-monomers can also used in UV-curable inks usable for ink jet.

These CEC-monomers can also used as one of the monomers used in a photopolymerizable composition usable for all other applications wherein the composition is crosslinked by irradiation, e.g. by UV irradiation or electron beam curing.

Support

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. A preferred support is a metal support such as aluminum or stainless steel. The metal can also be laminated to a plastic layer, e.g. polyester film.

A particularly preferred lithographic support is an electrochemically grained and anodized aluminum support. Graining and anodization of aluminum is well known in the art. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a is slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

Coating

The heat-sensitive coating, which is provided on the support, comprises an infrared absorbing agent and a CEC as defined above. The coating preferably further comprises a binder. The coating may be positive-working or negative-working.

A positive-working heat-sensitive coating is preferred. The coating of a positive-working heat-sensitive coating does not dissolve in an alkaline developing solution in the unexposed areas and becomes soluble in the exposed areas within the time used for developing the plate. The coating may be composed of one layer. In another embodiment, the coating may comprise several layers. In a more preferred embodiment, the coating comprises two layers, each of them having a different composition.

In a first preferred embodiment of the present invention, said coating comprises a binder which is a phenolic resin. Said phenolic resin is an alkaline soluble oleophilic resin whereof the solubility in an alkaline developing solution is reduced in the coating and whereof the solubility in an alkaline developing solution is increased upon heating or IR-radiation. The coating preferably further comprises a dissolution inhibitor whereby the rate of dissolution in an alkaline developing solution is reduced. Due to this solubility differential the rate of dissolution of the exposed areas is sufficiently higher than in the non-exposed areas.

The phenolic resin is preferably a novolac, a resol or a polyvinylphenolic resin; novolac is more preferred. Typical examples of such polymers are described in DE-A-4007428, DE-A-4027301 and DE-A-4445820. Other preferred polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/03568/or EP 1 506 858.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used. In a preferred embodiment of the present invention, the novolac resin is a p-cresol/formaldehyde condensation polymer.

The weight average molecular weight, measured by gel permeation chromatography using universal calibration and polystyrene standards, of the novolac resin is preferably from 500 to 150,000 g/mol, more preferably from 1,500 to 50,000 g/mol.

The poly(vinylphenol) resin may also be a polymer of one or more hydroxy-phenyl containing monomers such as hydroxystyrenes or hydroxy-phenyl (meth)acrylates. Examples of such hydroxystyrenes are o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl (meth)acrylate is 2-hydroxy-phenyl methacrylate.

The poly(vinylphenol) resin may usually be prepared by polymerizing one or more hydroxy-phenyl containing monomer in the presence of a radical initiator or a cationic polymerization initiator. The poly(vinylphenol) resin may also be prepared by copolymerizing one or more of these hydroxy-phenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

Examples of phenolic resins are:

POL-01: ALNOVOL™ SPN452 is a solution of a novolac resin, 40% by weight in Dowanol™ PM, obtained from CLARIANT GmbH.

Dowanol™ PM consists of 1-methoxy-2-propanol (>99.5%) and 2-methoxy-1-propanol (<0.5%).

POL-02: ALNOVOL™ SPN400 is a solution of a novolac resin, 44% by weight in Dowanol™ PMA, obtained from CLARIANT GmbH.

Dowanol™ PMA consists of 2-methoxy-1-methyl-ethylacetate.

POL-03: ALNOVOL™ HPN100 a novolac resin obtained from CLARIANT GmbH.

POL-04: DURITE™ PD443 is a novolac resin obtained from BORDEN CHEM. INC.

POL-05: DURITE™ SD423A is a novolac resin obtained from BORDEN CHEM. INC.

POL-06: DURITE™ SD126A is a novolac resin obtained from BORDEN CHEM. INC.

POL-07: BAKELITE™ 6866LB02 is a novolac resin obtained from BAKELITE AG.

POL-08: BAKELITE™ 6866LB03 is a novolac resin obtained from BAKELITE AG.

POL-09: KR 400/8 is a novolac resin obtained from KOYO CHEMICALS INC.

POL-10: HRJ 1085 is a novolac resin obtained from SCHNECTADY INTERNATIONAL INC.

POL-11: HRJ 2606 is a phenol novolac resin obtained from SCHNECTADY INTERNATIONAL INC.

POL-12: LYNCUR™ CMM is a copolymer of 4-hydroxystyrene and methyl methacrylate obtained from SIEER HEGNER.

In another preferred embodiment of the present invention, said binder of the coating is insoluble in water and soluble in an alkaline solution, such as an organic polymer which has acidic groups with a pKa of less than 13 to ensure that the layer is soluble or at least swellable in aqueous alkaline developers. Advantageously, the binder is a polymer or polycondensate, for example a polyester, a polyamide resin, an epoxy resin, an acetal resin, an acrylic resin, a methacrylic resin, a styrene based resin, a polyurethane resin or polyurea. The polymer may have one or more functional groups selected from a sulfonamide group, an active imide group, a carboxyl group, a sulfonic group or a phosphoric group.

In another more preferred embodiment of the present invention, said binder of the coating is a polymer comprising at least one sulfonamide group. This sulfonamide group is preferably present in the side chain of the monomeric unit of the polymer and has preferably the structure of formula VII $$*\text{—}(Ar)_d\text{—}SO_2\text{—}NH\text{—}(CO)_e\text{-}D^1 \quad \text{(Formula VII)}$$

wherein

* indicates the binding site of the sulfonamide group on a side chain of the monomeric unit of the polymer;

Ar represents an aromatic group;

d is 0 or 1;

e is 0 or 1;

$D^1$ represents a hydrogen, an optionally substituted hydrocarbon group such as an optionally substituted alkyl, alkenyl, alkynyl, aryl, alkaryl, aralkyl or heteroaryl group, $-OD^2$ or $—ND^3D^4$;

$D^2$ represents an optionally substituted hydrocarbon group such as an optionally substituted alkyl, alkenyl, alkynyl, aryl, alkaryl, aralkyl or heteroaryl group; and $D^3$ and $D^4$ independently represent a hydrogen or an optionally substituted hydrocarbon group such as an optionally substituted alkyl, alkenyl, alkynyl, aryl, alkaryl, aralkyl or heteroaryl group, or wherein $D^3$ and $D^4$ together represent the necessary atoms to form a ring.

The Ar group in formula VII is preferably an optionally substituted phenylene group, more preferably the structure of formula VIII (Formula VIII)

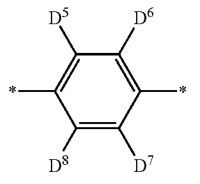

wherein indicates the binding sites of the divalent phenylene group in the structure of formula VII;

$D^5$ to $D^8$ represents a hydrogen, halogen, $—NR^4R^5$, $—CO—NR^4R^5$, $—SO_2—NR^4R^5$, $—COR^6$, $—CN$, $—NO_2$, $—COOR^6$, $—OR^3$, $—SR^3$, $—SOR^3$, $—SO_2R^6$, $—SO_3R^6$, $—PO_4R^4R^5$, $—PO_3R^4R^5$, $—NR^6—CO—NR^4R^5$, $—O—COOR^6$, $—NR^4—COOR^5$, $—NR^4—CO—R^5$, a phosphoramidate group or an optionally substituted hydrocarbon group such as an optionally substituted alkyl, alkenyl, alkynyl, aryl, alkaryl, aralkyl or heteroaryl group, or wherein $D^5$ and $D^6$ together represent the necessary atoms to form a ring, or wherein $D^7$ and $D^8$ together represent the necessary atoms to form a ring, and wherein $R^3$ represents an optionally substituted alkyl, alkenyl, alkynyl, aryl, alkaryl, aralkyl or heteroaryl group, and wherein $R^4$, $R^5$ and $R^6$ independently represent a hydrogen or one of the groups as defined for R3, or wherein two groups selected from R4, R5 and R6 together represent the necessary atoms to form a ring.

The index d in formula VII is preferably 1.

The index e in the formula VII is preferably 0.

In another preferred embodiment, the index e in the formula VII is 0 and the group D1 in the formula VII is a hydrogen atom.

In a more preferred embodiment, the index d in the formula VII is 1, the index e in the formula VII is 0 and the group D1 in the formula VII is a hydrogen atom.

The polymer comprising a sulfonamide group is hereinafter also referred to as "sulphonamide binder" or "sulphonamide polymer" or "SA-polymer" or "SA-binder". This sulfonamide polymer can be obtained via several routes, e.g. by grafting the group of formula VII on a polymer.

In a more preferred method, this sulfonamide polymer can be formed by polymerization of a monomer having said sulphonamide group having the structure of formula VII, hereinafter this monomer is also referred to as "sulfonamide monomer" or "SA-monomer". In this SA-monomer, the sulphonamide group as defined above is chemically bound on the side chain of a monomer.

In a preferred embodiment of the present invention, said SA-monomer has the structure of formula IX (Formula IX)

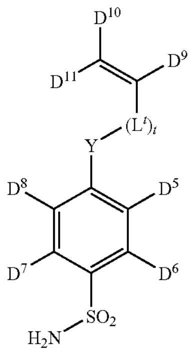

wherein $D^9$, $D^{10}$ and $D^{11}$ independently represent a hydrogen or an alkyl group such as methyl, ethyl or propyl; preferably $D^9$ is hydrogen or methyl; preferably $D^{10}$ and $D^{11}$ are a hydrogen;

$L^t$ represents a divalent linking group; preferably $L^t$ is —CO—, —O—, —NH—, alkylene such as methylene, ethylene, propylene or butylene group; more preferably $L^t$ is —CO—;

t is 0 or 1; preferably t is 1;

Y represents a divalent linking group; preferably Y is an alkylene group such as methylene, ethylene, propylene or butylene group, —O—, —NH—, or a combination of them; more preferably Y is —NH—; and $D^5$ to $D^8$ represent at least one of the same groups as defined above in formula VIII.

In another preferred embodiment of the present invention, said

SA-monomer has the structure of formula X (Formula X)

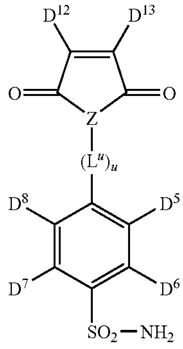

wherein $D^{12}$ and $D^{13}$ independently represent a hydrogen or an alkyl group such as methyl, ethyl or propyl; preferably $D^{12}$ and $D^{13}$ are a hydrogen;

Z represents trivalent linking group, preferably Z is N or a $CR^z$ group wherein $R^z$ is hydrogen or an optionally substituted alkyl, alkenyl or aryl group, preferably Z is N;

$L^u$ represents a divalent linking group, preferably an alkylene group such as methylene, ethylene, propylene or butylene group, —O—, —NH—, or a combination of them;

u is 0 or 1; and $D^5$ to $D^8$ represent at least one of the same groups as defined above in formula VIII.

Examples of SA-monomers are

SA-MON-01:

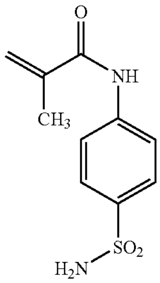

SA-MON-02:

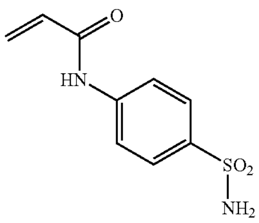

SA-MON-03:

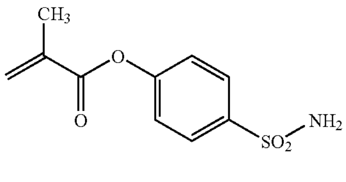

-continued

SA-MON-04:

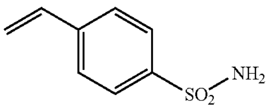

SA-MON-05:

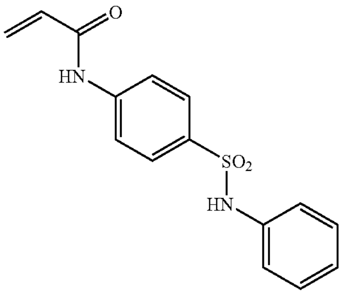

SA-MON-06:

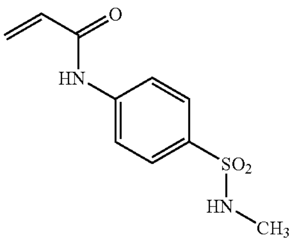

SA-MON-07:

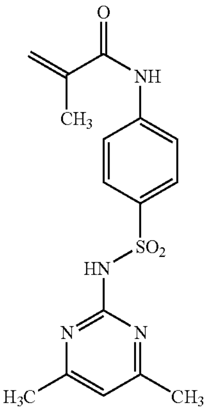

SA-MON-08:

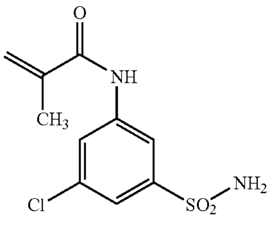

-continued

SA-MON-09:

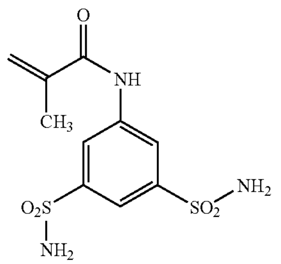

SA-MON-10:

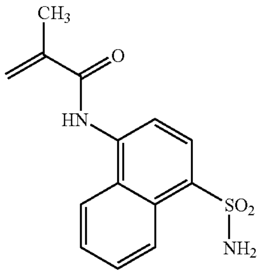

SA-MON-11:

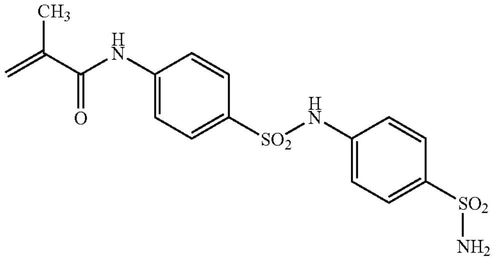

SA-MON-12:

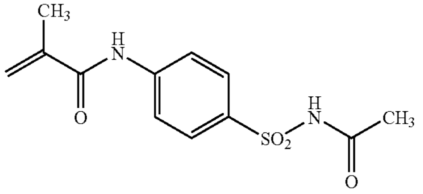

SA-MON-13:

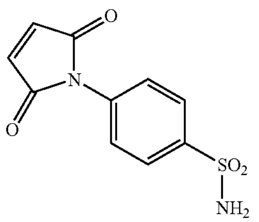

The sulphonamide polymer may further comprise one or more other monomeric units, preferably selected from an alkyl or aryl (meth)acrylate such as methyl (meth)acrylate, ethyl (meth)acrylate, butyl (meth)acrylate, benzyl (meth) acrylate, 2-phenylethyl (meth)acrylate, hydroxylethyl (meth) acrylate, phenyl (meth)acrylate; (meth)acrylic acid; (meth) acrylamide; a N-alkyl or N-aryl (meth)acrylamide such as N-methyl (meth)acrylamide, N-ethyl (meth) acrylamide, N-phenyl (meth) acrylamide, N-benzyl (meth)acrylamide, N-methylol (meth)acrylamide, N-(4-hydroxyphenyl) (meth) acrylamide, N-(4-methylpyridyl)(meth)acrylate; (meth) acrylonitrile; styrene; a substituted styrene such as 2-, 3- or 4-hydroxy-styrene, 4-benzoic acid-styrene; a vinylpyridine such as 2-vinylpyridine, 3-vinylpyridine, 4-vinylpyridine; a substituted vinylpyridine such as 4-methyl-2-vinylpyridine; vinyl acetate, optionally the copolymerised vinyl acetate monomeric units are at least partially hydrolysed, forming an alcohol group, and/or at least partially reacted by an aldehyde compound such as formaldehyde or butyraldehyde, forming an acetal or butyral group; vinyl alcohol; vinyl acetal; vinyl butyral; a vinyl ether such as methyl vinyl ether; vinyl amide; a N-alkyl vinyl amide such as N-methyl vinyl amide, caprolactame, vinyl pyrrolydone; maleimide; a N-alkyl or N-aryl maleimide such as N-benzyl maleimide.

In another embodiment of the present invention, the sulphonamide polymer may further comprise one or more CEC-monomers, preferably in an amount ranging between 0.5 and 50 mol % related to the total amount of monomeric units in the polymer, more preferably between 1 and 40 mol %, most preferably between 2.5 and 25 mol %. These polymers having a sulphonamide group and also a CEC-monomer or a CEC compound bound on the side chain of a monomeric unit of the sulphonamide polymer are hereinafter also referred to as "SA-CEC-polymer" or "SA-CEC-binder".

Examples of SA-polymers having the following monomeric units are:

SA-POL-01

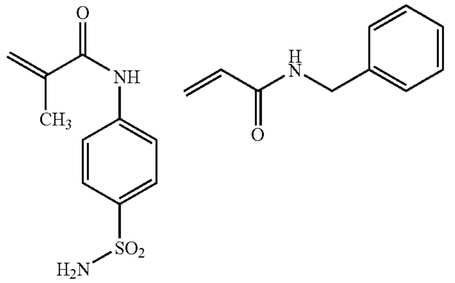

SA-POL-02

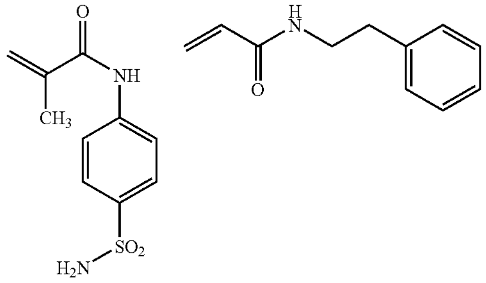

SA-POL-03

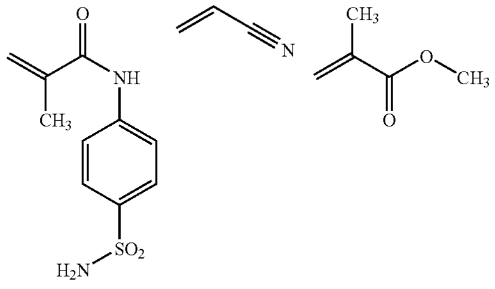

-continued
SA-POL-04
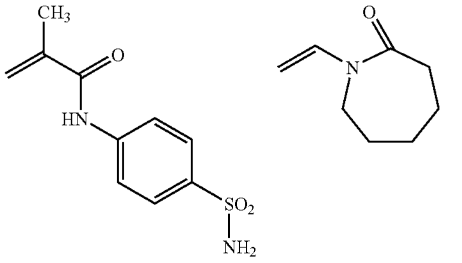
SA-POL-05
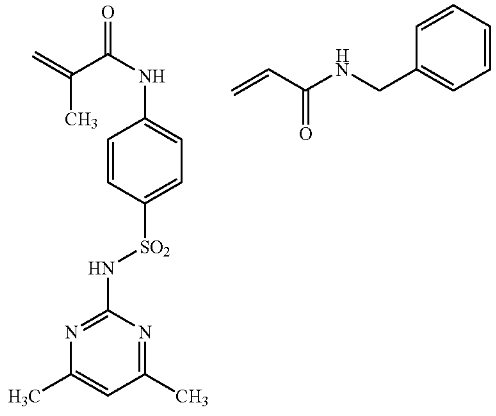
SA-POL-06
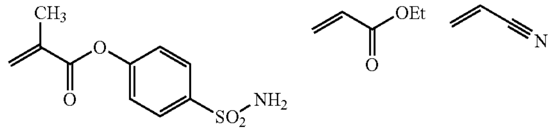
SA-POL-07
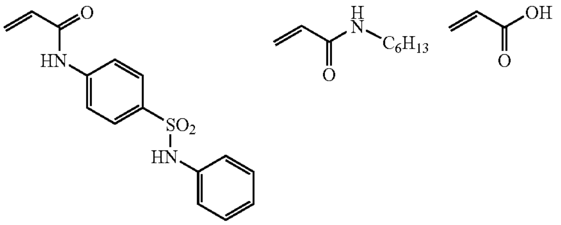
SA-POL08
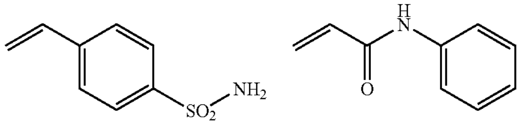
SA-POL-09
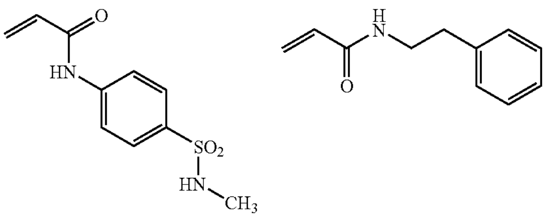
-continued
SA-POL-10
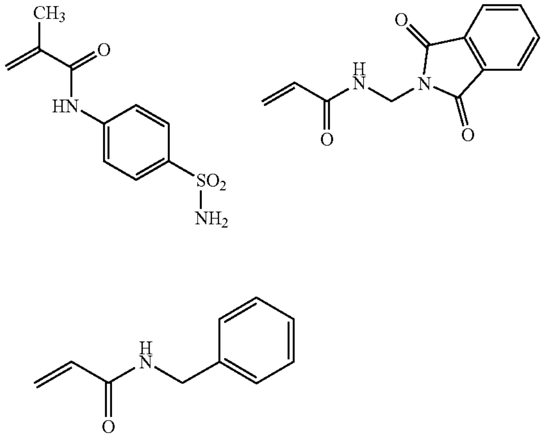
SA-POL-11
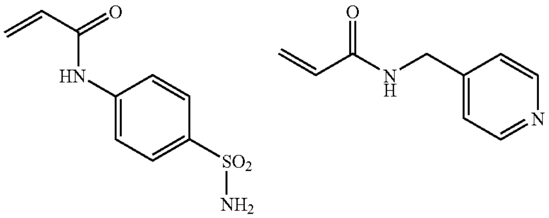
SA-POL-12
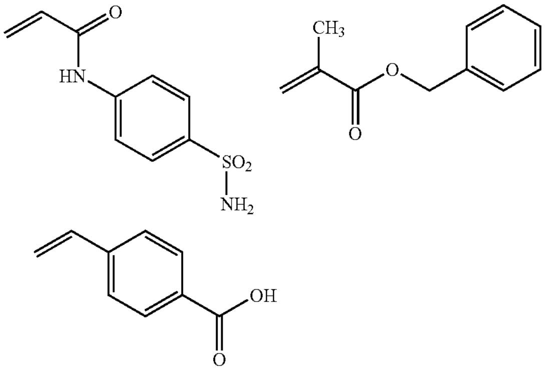
SA-POL-13
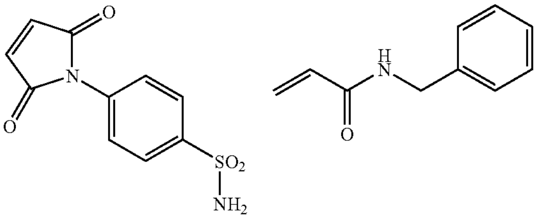
SA-POL-14
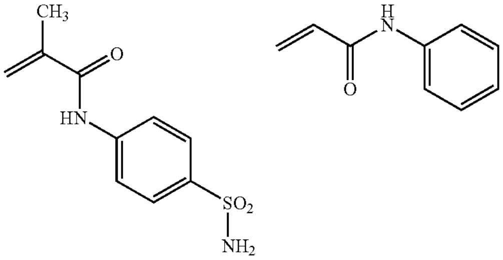

-continued
SA-POL-15
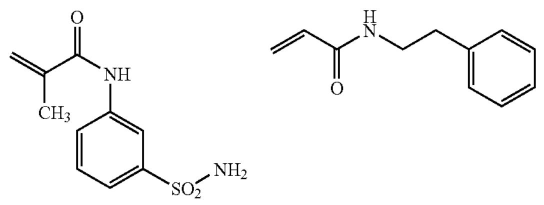
SA-POL-16
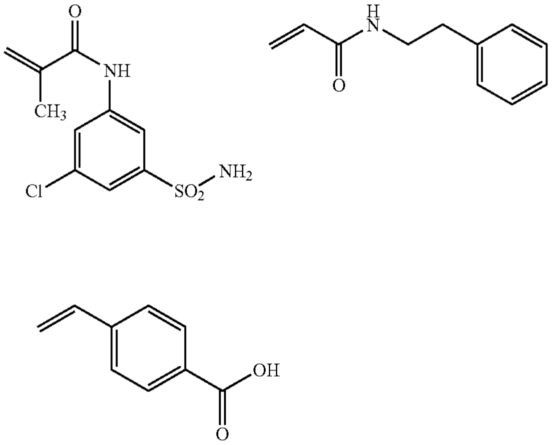
SA-POL-17
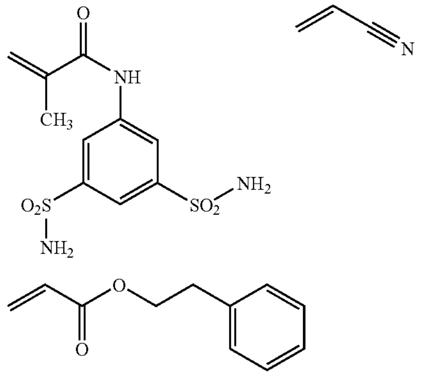
SA-POL-18
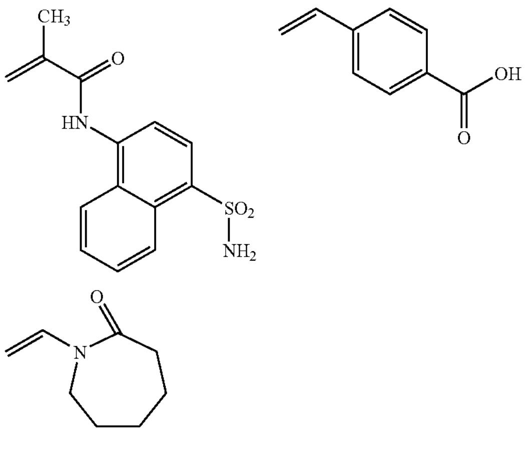
-continued
SA-POL-19
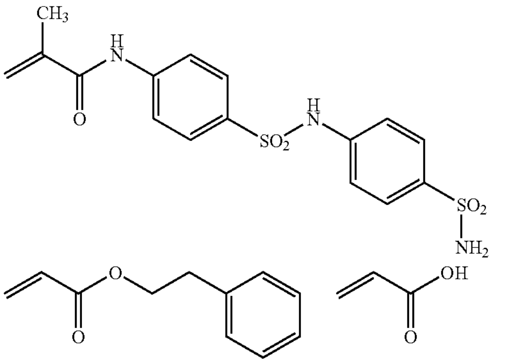
SA-POL-20
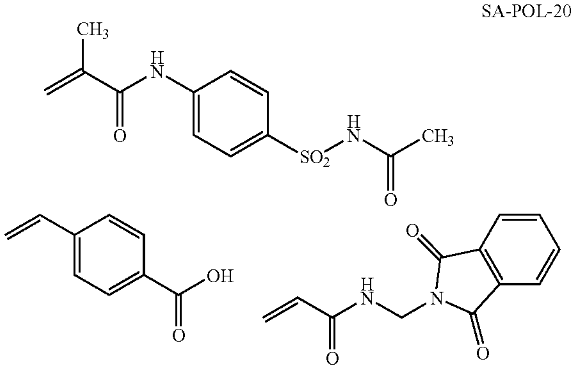
SA-POL-21
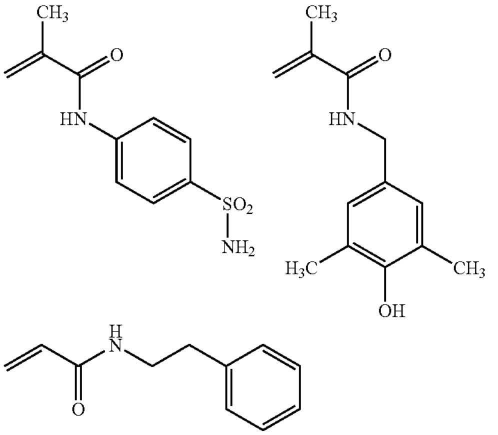
SA-POL-22
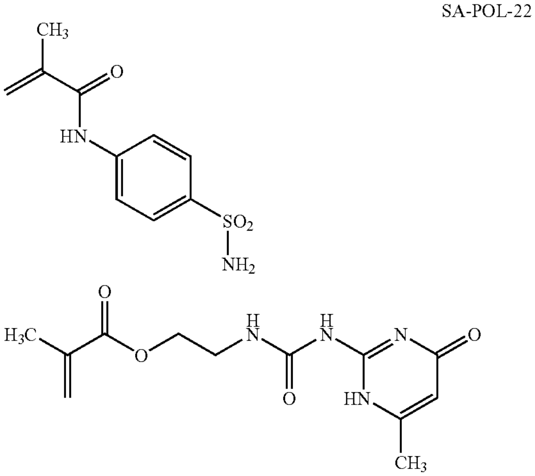

-continued

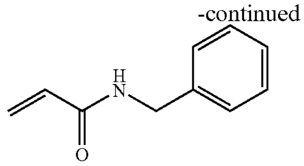

The sulphonamide (co)polymers may be linear or branched and may contain the comonomers ad random distributed. The polymers may also be a block or graft copolymer containing chain segments of a specific monomer, e.g. chain segments of a SA-monomer. The sulfonamide polymers contain a SA-monomer in an amount of preferably at least 1 mol %, more preferably at least 5 mol %, most preferably at least 10 mol %, and the upper limit of the amount incorporated in these polymers is preferably 100 mol %, more preferably at most 95 mol %, most preferably at most 80 mol %.

In another embodiment of the present invention, said coating may comprise other polymers having an active imide group such as —$SO_2$—NH—CO—$R^h$, —$SO_2$—NH—$SO_2$—$R^h$ or —CO—NH—$SO_2$—$R^h$ wherein $R^h$ represents an optionally substituted hydrocarbon group such as an optionally substituted alkyl, aryl, alkaryl, aralkyl or heteroaryl group. Polymers comprising a N-benzyl-maleimide monomeric unit can also be added to the coating and can be selected from the polymers as described in EP-A 933 682, EP 0 894 622 (page 3 line 16 to page 6 line 30), EP-A 0 982 123 (page 3 line 56 to page 51 line 5), EP-A 1 072 432 (page 4 line 21 to page 10 line 29) and WO 99/63407 (page 4 line 13 to page 9 line 37). In an embodiment of the present invention, these polymers may further comprise one or more CEC-monomer as defined above, preferably in an amount ranging between 0.5 and 50 mol % related to the total amount of monomeric units in the polymer, more preferably between 1 and 40 mol %, most preferably between 2.5 and 25 mol %.

In another embodiment of the present invention, said coating may comprise other polymers having an acidic group which can be selected from polycondensates and polymers having free phenolic is hydroxyl groups, as obtained, for example, by reacting phenol, resorcinol, a cresol, a xylenol or a trimethylphenol with aldehydes, especially formaldehyde, or ketones. Condensates of sulfamoyl- or carbamoyl-substituted aromatics and aldehydes or ketones can also be added to the coating. Polymers of bismethylol-substituted ureas, vinyl ethers, vinyl alcohols, vinyl acetals or vinylamides and polymers of phenylacrylates and copolymers of hydroxy-phenylmaleimides are likewise suitable to add to the coating. Furthermore, polymers having units of vinylaromatics, N-aryl (meth)acrylamides or aryl (meth)acrylates may also be added to the coating, it being possible for each of these units also to have one or more carboxyl groups, phenolic hydroxyl groups, sulfamoyl groups or carbamoyl groups. Specific examples include polymers having units of 2-hydroxyphenyl (meth) acrylate, of N-(4-hydroxyphenyl)(meth)acrylamide, of N-(4-sulfamoylphenyl)-(meth)acrylamide, of N-(4-hydroxy-3,5-dimethylbenzyl)-(meth)acrylamide, or 4-hydroxystyrene or of hydroxyphenylmaleimide. The polymers may additionally contain units of other monomers which have no acidic units. Such units include vinylaromatics, methyl (meth)acrylate, phenyl(meth)acrylate, benzyl (meth)acrylate, methacrylamide or acrylonitrile. In an embodiment of the present invention, all these polymers may further comprise one or more CEC-monomers by copolymerisation or a CEC compound bond on the side chain of a monomeric unit of the polymer, preferably in an amount ranging between 0.5 and 50 mol % related to the total amount of monomeric units in the polymer, more preferably between 1 and 40 mol %, most preferably between 2.5 and 25 mol %. These polymer are hereinafter also referred to as "CEC-polymer" or "CEC-binder".

In accordance with another embodiment of the present invention, the heat-sensitive coating may comprise more than one layer. In a preferred embodiment, the coating comprises two layers, a first so layer and a second layer. The first layer is the inner layer, present between the second layer and the hydrophilic surface of the support and the second layer is the outer layer, present on the first layer. At least one of these layers comprises one or more different types of a CEC compounds as defined above in at least one of the formulae I to VI or at least one of the compounds CEC-01 to CEC-27. The same CEC can also be present in both layers, but each layer may contain a specific CEC. In a specific embodiment of the present invention, each of these layers may also comprise a CEC-polymer or SA-CEC-polymer as defined above, optionally in combination with a CEC compound as defined above.

In another specific embodiment, the first layer (i.e. inner layer) may comprise a sulfonamide polymer and/or a SA-CEC-polymer as defined above and the second layer (i.e. outer layer) may comprise also a sulfonamide polymer or another polymer such as a polymer having an active imide group as defined above. At least one of these layers comprises a CEC, a CEC-polymer and/or a SA-CEC-polymer, preferably a CEC or CEC-polymer is present in the second layer.

In another specific embodiment, the first layer (i.e. inner layer) may comprise a sulfonamide polymer as defined above and the second layer (i.e. outer layer) may comprise a phenolic resin. At least one CEC or CEC-polymer is present in at least one of these layers, preferably in the first layer.

Optionally, the heat-sensitive coating comprising a first layer (i.e. inner layer) and a second layer (i.e. outer layer) may further comprise a top layer on top of the outer layer and this top layer preferably comprises a water-repellent polymer comprising siloxane and/or perfluoroalkyl units, more preferably comprising a siloxane unit.

In another optional embodiment, the heat-sensitive coating may comprise a first intermediate layer between the hydrophilic surface of the support and the first layer (i.e. inner layer). This intermediate layer may comprise a polymer, optionally in combination with a CEC compound. This intermediate layer preferably comprises a phenolic resin, a SA-polymer, a polymer having an active imide group, a CEC-polymer or a SA-CEC-polymer; more preferably a SA-polymer, a polymer having an active imide group or a CEC-polymer; most preferably a SA-polymer or a CEC-polymer.

In another optional embodiment, the heat-sensitive coating may comprise a second intermediate layer between the first layer (i.e. inner layer) and the second layer (i.e. outer layer). This intermediate layer may comprise a polymer, optionally in combination with a CEC compound. This intermediate layer preferably comprises a phenolic resin, a SA-polymer, a polymer having an active imide group or a CEC-polymer; more preferably a SA-polymer, a phenolic resin or a CEC-polymer; most preferably a phenolic resin or a CEC-polymer.

According to the present invention, the lithographic printing plate precursor comprises said CEC compound in an amount preferably ranging between $0.05.10^{-3}$ mol/$m^2$ and $10.0.10^{-3}$ mol/$m^2$, more preferably between $0.08.10^{-3}$ mol/$m^2$ and $5.0.10^{-3}$ mol/$m^2$, most preferably between $0.15.10^{-3}$ mol/$m^2$ and $2.0.10^{-3}$ mol/$m^2$. When a CEC-polymer or SA-CEC-polymer is used in the heat-sensitive coating, the CEC-polymer or SA-CEC-polymer is present in an amount preferably ranging between 0.05 $g/m^2$ and 5 $g/m^2$, more preferably between 0.1 $g/m^2$ and 2.5 $g/m^2$, most preferably between 0.15 $g/m^2$ and 1.5 $g/m^2$.

Dissolution Inhibitor

In a preferred embodiment of the present invention, the heat-sensitive coating or a layer of the heat-sensitive coating also contain one or more dissolution inhibitors. Dissolution inhibitors are compounds which reduce the dissolution rate of the hydrophobic polymer in the aqueous alkaline developer at the non-exposed areas of the coating and wherein this reduction of the dissolution rate is destroyed by the heat generated during the exposure so that the coating readily dissolves in the developer at exposed areas. The dissolution inhibitor exhibits a substantial latitude in dissolution rate between the exposed and non-exposed areas. By preference, the dissolution inhibitor has a good dissolution rate latitude when the exposed coating areas have dissolved completely in the developer before the non-exposed areas are attacked by the developer to such an extent that the ink-accepting capability of the coating is affected. The dissolution inhibitor(s) can be added to the layer which comprises the hydrophobic polymer discussed above.

The dissolution rate of the non-exposed coating in the developer is preferably reduced by interaction between the hydrophobic polymer and the inhibitor, due to e.g. hydrogen bonding between these compounds. Suitable dissolution inhibitors are preferably organic compounds which comprise at least one aromatic group and a hydrogen bonding site, e.g. a carbonyl group, a sulfonyl group, or a nitrogen atom which may be quaternized and which may be part of a heterocyclic ring or which may be part of an amino substituent of said organic compound. Suitable dissolution inhibitors of this type have been disclosed in e.g. EP-A 825 927 and 823 327.

Water-repellent polymers represent an another type of suitable dissolution inhibitors. Such polymers seem to increase the developer resistance of the coating by repelling the aqueous developer from the coating. The water-repellent polymers can be added to the layer comprising the first polymer and/or can be present in a separate layer provided on top of the layer with the first polymer. In the latter embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP-A 864420, EP-A 950 517 and WO99/21725. Preferred examples of the water-repellent polymers are polymers comprising siloxane and/or perfluoroalkyl units. In one embodiment, the coating contains such a water-repellent polymer in an amount between 0.5 and 25 $g/m^2$, preferably between 0.5 and 15 $mg/m^2$ and most preferably between 0.5 and 10 $mg/m^2$. When the water-repellent polymer is also ink-repelling, e.g. in the case of polysiloxanes, higher amounts than 25 $mg/m^2$ can result in poor ink-acceptance of the non-exposed areas. An amount lower than 0.5 $mg/m^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R, R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellent polymer is a block-copolymer or a graft-copolymer of a poly(alkylene oxide) block and a block of a polymer comprising siloxane and/or perfluoroalkyl units. A suitable copolymer comprises about 15 to 25 siloxane units and 50 to 70 alkylene oxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germeny. Such a copolymer acts as a surfactant which upon coating, due to its bifunctional structure, automatically positions itself at the interface between the coating and air and thereby forms a separate top layer even when the whole coating is applied from a single coating solution. Simultaneously, such surfactants act as a spreading agent which improves the coating quality. Alternatively, the water-repellent polymer can be applied in a second solution, coated on top of the layer comprising the hydrophobic polymer. In that embodiment, it may be advantageous to use a solvent in the second coating solution that is not capable of dissolving the ingredients present in the first layer so that a highly concentrated water-repellent phase is obtained at the top of the coating.

Development Accelerator

Preferably, also one or more development accelerators are included in the heat-sensitive coating or in a layer of the heat-sensitive coating, i.e. compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids. Examples of the cyclic acid anhydride include phthalic anhydride, tetrahydrophthalic anhydride, hexahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 205 by weight, relative to the coating as a whole.

In a negative-working printing plate precursor, the heat-sensitive coating at the non-exposed areas dissolves in an alkaline developing solution and defines non-image (non-printing) areas, and the exposed areas of the coating become insoluble within the time used for developing the plate and define the image (printing) areas. According to the present invention, the heat-sensitive coating comprises an infrared absorbing agent and a CEC as defined above.

The negative-working coating further comprises preferably a latent Brönsted acid which produces acid upon heating or IR radiation and a polymer. Said polymer is preferably a phenolic resin. The acid catalyzes crosslinking of the coating, optionally in a post-exposure heating step, and thus hardening of the exposed regions. Accordingly, the non-exposed regions can be washed away by a developer to reveal the hydrophilic substrate underneath. For a more detailed description of such a negative-working printing plate precursor we refer to U.S. Pat. No. 6,255,042 and U.S. Pat. No. 6,063,544 and to references cited in these documents. In a preferred embodiment, the CEC-polymer is added to the coating composition and replaces at least part of the phenolic resin, optionally in combination with a low molecular weight CEC compound.

The negative-working coating may comprise at least one layer. In another embodiment, the coating may comprise a first layer and a second layer, the first layer being present between the hydrophilic surface of the support and the second layer. Optionally, the coating may further comprise a first intermediate layer between the hydrophilic support and the first layer and/or a second intermediate layer between the first layer and the second layer. In another option, the coating may further comprise a top layer on top of the coating. In at least one of these layers, a CEC compound or a CEC-polymer is present.

Exposure

The material can be image-wise exposed directly with heat, e.g. by means of a thermal head, or indirectly by infrared light, which is preferably converted into heat by an infrared light absorbing compound, which may be a dye or pigment having an absorption maximum in the infrared wavelength range. The infrared light absorbing dye or pigment is preferably present in the heat-sensitive coating or in a layer of the heat-sensitive coating and typically in a concentration ranging between 0.25 and 10.0 wt. %, more preferably between 0.5 and 7.5 wt. % relative to the coating as a whole. Preferred IR-absorbing compounds are dyes such as cyanine or merocyanine dyes or pigments such as carbon black. A suitable compound is the following infrared dye IR-1:

(IR-1)

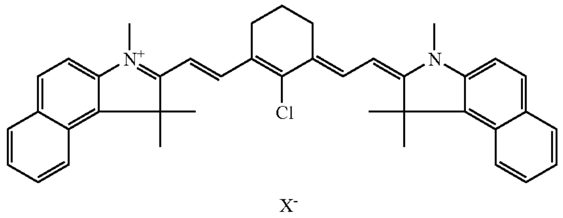

wherein $X^-$ is a suitable counter ion such as tosylate.

The heat-sensitive coating or a layer of the heat-sensitive coating may further contain an organic dye which absorbs visible light so that a perceptible image is obtained upon image-wise exposure and subsequent development. Such a dye is often called contrast dye or indicator dye. Preferably, the dye has a blue color and an absorption maximum in the wavelength range between 600 nm and 750 nm. Although the dye absorbs visible light, it preferably does not sensitize the printing plate precursor, i.e. the coating does not become more soluble in the developer upon exposure to visible light. Suitable examples of such a contrast dye are the quaternized triarylmethane dyes.

According to a preferred embodiment, the contrast dye is present in the heat-sensitive coating or in a layer of the heat-sensitive coating.

According to a highly preferred embodiment, the infrared light absorbing compound is concentrated in the heat-sensitive coating or a layer of the heat-sensitive coating.

The printing plate precursor of the present invention can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

In the development step, the non-image areas of the coating are removed by immersion in an aqueous alkaline developer, which may be combined with mechanical rubbing, e.g. by a rotating brush. The developer comprises an alkaline agent which may be an inorganic alkaline agent such as an alkali metal hydroxide, an organic alkaline agent such as an amine, and/or an alkaline silicate such as an alkali metal silicate or an alkali metal metasilicate. The developer preferably has a pH above 10, more preferably above 12. The developer may further contain components such as a buffer substance, a complexing agent, an antifoaming agent, an organic solvent, a corrosion inhibitor, a dye, an antisludge agent, a dissolution preventing agent such as a non-ionic surfactant, an anionic, cationic or amphoteric surfactant and/or a hydrotropic agent as known in the art. The developer may further contain a poly hydroxyl compound such as e.g. sorbitol, preferably in a concentration of at least 40 g/l, and also a polyethylene oxide containing compound such as e.g. Supronic B25, commercially available from RODIA, preferably in a concentration of at most 0.15 g/l.

The development step may be followed by a rinsing step and/or a gumming step. The gumming step involves post-treatment of the lithographic printing plate with a gum solution. A gum solution is typically an aqueous liquid which comprises one or more surface protective compounds that are capable of protecting the lithographic image of a printing plate against contamination or damaging. Suitable examples of such compounds are film-forming hydrophilic polymers or surfactants.

The plate precursor can, if required, be post-treated with a suitable correcting agent or preservative as known in the art. To increase the resistance of the finished printing plate and hence to extend the run length, the layer can be briefly heated to elevated temperatures ("baking"). The plate can be dried before baking or is dried during the baking process itself.

During the baking step, the plate can be heated at a temperature which is higher than the glass transition temperature of the heat-sensitive coating, e.g. between 100° C. and 230° C. for a period of 40 seconds to 5 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447,963 and GB 1,154,749.

The printing plate thus obtained can be used for conventional, so-called wet offset printing, in which ink and an aqueous dampening liquid is supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

Synthesis of the CEC Compounds CEC-01 to CEC-11

Synthesis Example 1

The synthesis of 3-methyl-1H-pyrido[2,3-d]pyrimidine-2,4-dione (CEC-01)

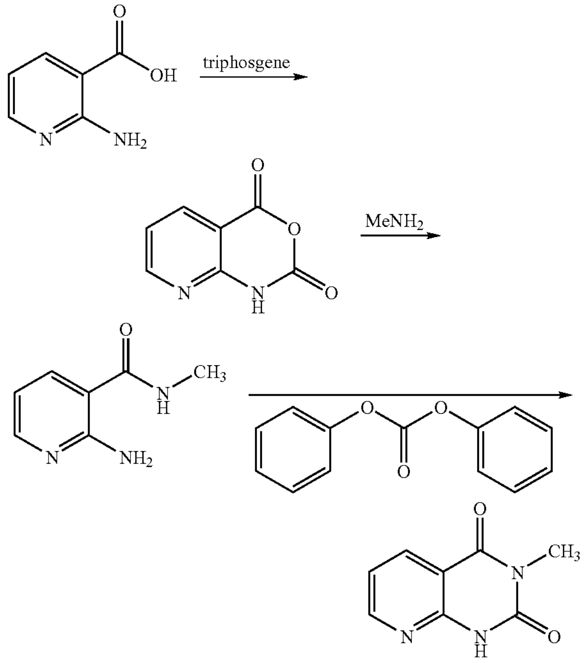

24.8 g (0.18 mol) 2-aminonicotinic acid was suspended in 130 ml dry acetonitrile. The mixture was heated to 50° C. and simultaniously 28.5 g (29 ml, 0.36 mol) pyridine and a solution of 17.8 g (0.06 mol) triphosgene in 100 ml methylene chloride were added dropwise, while keeping the temperature between 50 and 55° C. After cooling down to room temperature, the crude 1H-Pyrido[2,3-d]oxazin-2,4-dione precipitated from the medium. The compound was isolated by filtration, washed with 100 ml water and dried. The compound was sufficiently pure to be used without further purification (m.p. 207° C.). 14.96 g of 1H-Pyrido[2,3-d]oxazin-2,4-dione (50%) was isolated.

14.96 g (0.09 mol) of 1H-Pyrido[2,3-d]oxazin-2,4-dione was suspended in 138 ml dioxane. The mixture is heated to 40° C. and 17 ml of a 33% solution of methyl amine in ethanol is added dropwise directly into the reaction mixture, to avoid carbamate formation with the evolving $CO_2$. The reaction is allowed to continue for 90 minutes. After cooling down to room temperature, the formed precipitate is removed by filtration and the filtrate is concentrated to dryness. 13.2 g (97%) of 2-aminonicotinic acid methyl amide was isolated (m.p. 140-2° C.).

10.0 g (66 mmol) of 2-aminonicotinic acid methyl amide, 21.4 g (100 mmol) diphenyl carbonate and 8.5 g (66 mmol) 4-dimethylaminopyridine were melted at 140 to 150° C. The reaction was allowed to continue for 20 minutes at that temperature. The mixture is allowed to cool down to 50 to 60° C. and 300 ml methanol was added while stirring. The mixture is allowed to cool down to room temperature. 3-methyl-1H-pyrido[2,3-d]pyrimidine-2,4-dione crystallized from the medium, was isolated by filtration and washed with water, methanol and tert.-butyl methyl ether. 7.80 g (67%) of 3-methyl-1H-pyrido[2,3-d]pyrimidine-2,4-dione was isolated (m.p. 272-4° C.).

Synthesis Example 2

The synthesis of 3-phenyl-1H-pyrido[2,3-d]pyrimidine-2,4-dione (CEC-02)

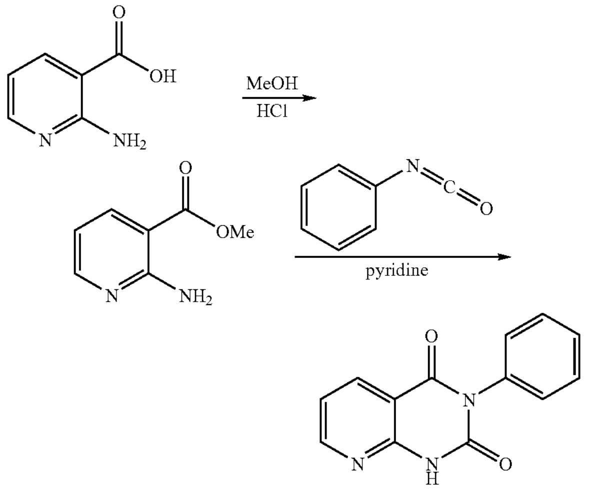

42.4 g (356.4 mmol, 26 ml) thionyl chloride was added dropwise to a suspension of 15.0 g (108.6 mmol) 2-aminonicotinic acid in 150 ml abs. Methanol, while cooling. The mixture was heated to reflux and the mixture was refluxed for 19 hours. The evolving $SO_2$ was scrubbed. The solvent was removed under reduced pressure after cooling down to room temperature. The residue was carefully treated with a satured $NaHCO_3$ solution and extracted with ethyl acetate. The organic fraction was dried over magnesium sulfate and the solvent was evaporated under reduced pressure. 9.13 g (55%) of 2-aminonicotinic acid methyl ester was isolated as a pale yellow solid (m.p. 83° C.).

17.22 g (144.6 mmol, 15.7 ml) phenylisocyanate was added to a suspenssion of 7.00 g (46.0 mmol) 2-aminonicotinic acid methyl ester in dry pyridine. The mixture was refluxed for 16 hours. The pyridine is was removed under reduced pressure and the residue was treated with 280 ml ethanol. The mixture is refluxed for 10 minutes. Upon cooling down 3-phenyl-1H-pyrido[2,3-d]pyrimidine-2,4-dione crystallized from the medium and was recrystallized from methoxypropanol. 6.73 g (61%) 3-phenyl-1H-pyrido[2,3-d]pyrimidine-2,4-dione was isolated (m.p. 304° C.).

Synthesis Example 3

The synthesis of 3-hexyl-1H-pyrido[2,3-d]pyrimidine-2,4-dione (CEC-03)

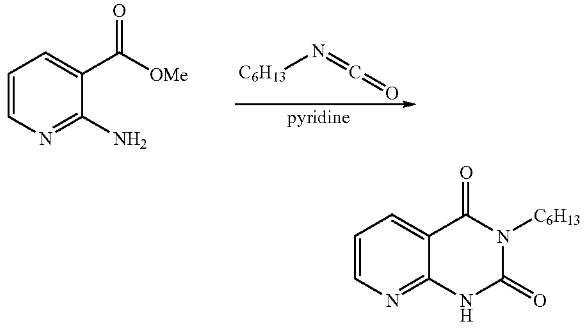

17.46 g (137.3 mmol, 20 ml)n-hexyl isocyanate was added to a suspension of 5.31 g (34.9 mmol) 2-aminonicotinic acid methyl ester in 130 ml dry pyridine. The mixture was refluxed for 24 hours. The pyridine was removed under reduced pressure and the residue was treated with 160 ml ethanol. The mixture was refluxed for 10 minutes. The crude 3-hexyl-1H-pyrido[2,3-d]pyrimidine-2,4-dione crystallized from the medium and was purified by preparative column chromatography on straight phase silica (eluent:ethyl acetate:cyclohexane 1:2). 3-hexyl-1H-pyrido[2,3-d]pyrimidine-2,4-dione crystallized upon evaporation of the eluent. 2.66 g (310) of 3-hexyl-1H-pyrido[2,3-d]pyrimidine-2,4-dione was isolated (m.p. 166-168° C.)

Synthesis Example 4

The synthesis of 3-ethyl-1H-pyrido[2,3-d]pyrimidine-2,4-dione (CEC-04)

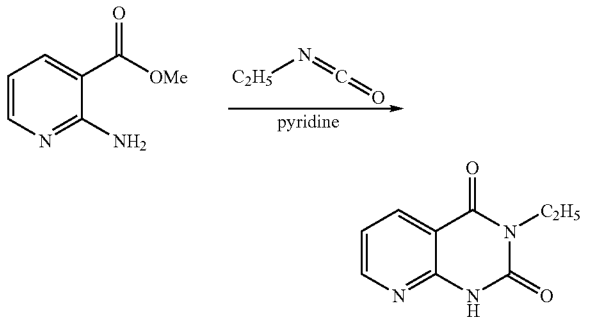

A mixture of 20.00 g (0.132 mol) of 2-aminonicotinic acid methyl ester, 17.67 g (0.248 mol) ethyl isocyanate and 2 g (0.016 mol) 4-dimethylaminopyridine in dry pyridine was refluxed for 23 hours. The pyridine was removed under reduced pressure and the residue was treated with 370 ml methanol. The mixture was refluxed for 10 minutes and allowed to cool down first to room temperature. The mixture is further cooled to 0° C. and the crude 3-ethyl-1H-pyrido[2,3-d]pyrimidine-2,4-dione was allowed to crystallize over night. The crude 3-ethyl-1H-pyrido[2,3-d]pyrimidine-2,4-dione was further purified by preparative column chromatography on straight phase silica (eluent:chloroform:methanol 9:1). The isolated 3-ethyl-1H-pyrido[2,3-d]pyrimidine-2,4-dione was recrystallized from dimethyl formamide, isolated by filtration and washed twice with ethanol and twice with tert butyl methyl ether. The isolated compound was further recrystallized from methanol. A first crop of 2.5 g was isolated. Upon concentration of the filtrate a second crop of 0.5 g was isolated. Both fractions were pooled and finally 3.00 g (12%) of 3-ethyl-1H-pyrido[2,3-d]pyrimidine-2,4-dione was isolated (m.p. 240-1° C.)

Synthesis Example 5

The synthesis of 1,6-Bis(2,4-dioxo-1H-pyrido[2,3-d]pyrimidin-3-yl)hexane (CEC-05)

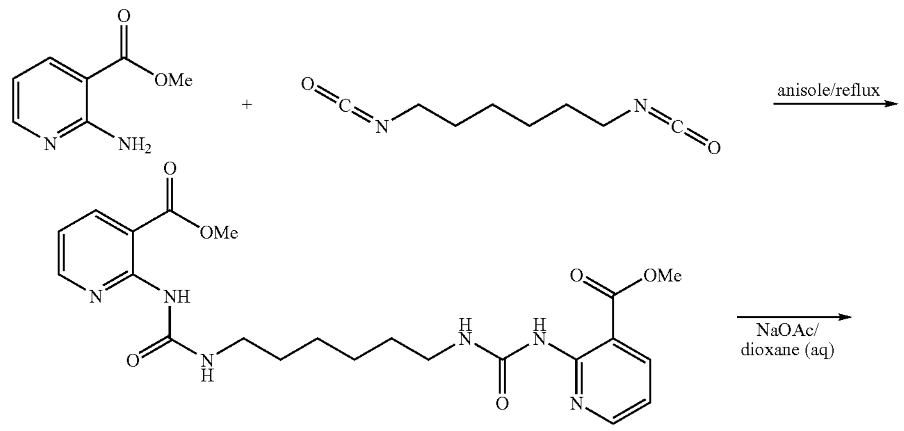

-continued

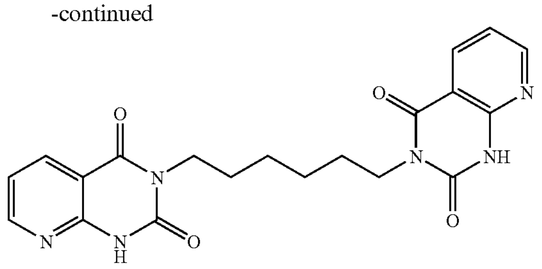

21.44 g (141 mmol) 2-aminonicotinic acid methyl ester in 180 ml anisole was heated to 150° C. 11.4 ml (11.9 g, 70.5 mmol) hexamethylene diisocyanate was added dropwise and the reaction was allowed to continue for 6 hours at 150° C. The mixture was allowed to cool down to room temperature and 700 ml tert-butyl methyl ether was added. Upon standing for 24 hours, 3,3'-di(3-methoxycarbonyl-pyridin-2-yl)-1,1'-hexan-1,6-diyl-bisureum crystallized from the medium. 3,3'-di(3-methoxycarbonyl-pyridin-2-yl)-1,1'-hexan-1,6-diyl-bisureum was isolated by filtration, washed three times with tert-butyl methyl ether and dried. 25.7 g (77%) 3,3'-di(3-methoxycarbonyl-pyridin-2-yl)-1,1'-hexan-1,6-diyl-bisureum was isolated (155-9° C.).

25.7 g (54 mmol) 3,3'-di(3-methoxycarbonyl-pyridin-2-yl)-1,1'-hexan-1,6-diyl-bisureum and 4.13 g (50 mmol) sodium acetate were dissolved in 355 ml dioxane and 235 ml water at 60° C. The reaction was allowed to continue for six and a half hours at 60° C. After 30 minutes at 60° C., the mixture was completely dissolved. After 2 hours, the reaction product started to crystallize. The mixture is allowed stand over night at room temperature. The crude 1,6-Bis(2,4-dioxo-1H-pyrido[2,3-d]pyrimidin-3-yl)hexane was isolated by filtration, washed twice with 50 ml methanol and twice with 50 ml chloroform and dried. The isolated compound was refluxed in 20 ml dimethyl formamide for a few minutes and allowed to crystallize. 1,6-Bis(2,4-dioxo-1H-pyrido[2,3-d]pyrimidin-3-yl)hexane was isolated by filtration, washed four times with 25 ml tert-butyl methyl ether and dried. 4.46 g (200) of 1,6-Bis(2,4-dioxo-1H-pyrido[2,3-d]pyrimidin-3-yl)hexane was isolated (m.p. 324-8° C.).

Synthesis Example 6

The synthesis of 6-phenyl-4,5,6,7-tetrahydro-[1,2,4]triazolo[1,5-a]pyrimidin-5-on (CEC-06)

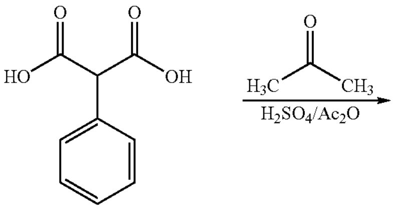

-continued

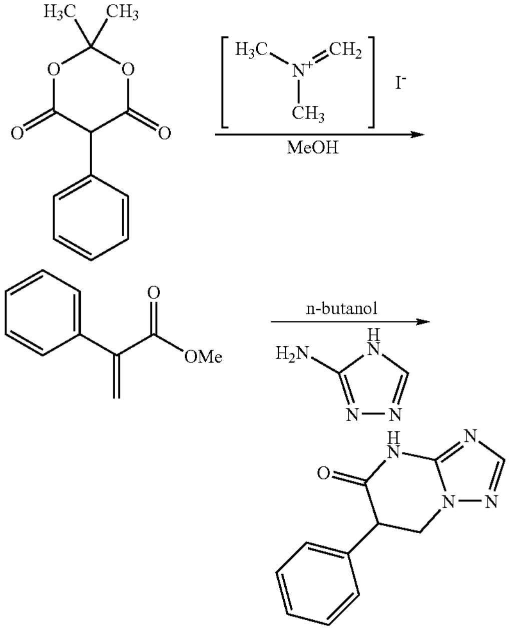

A suspension of 91.08 g (505.6 mmol) 2-phenyl malonic acid in 242 ml acetic anhydride was treated with 10 ml concentrated sulfuric is acid. The suspended compound dissolved and 61 ml acetone was added to the mixture. 2,2-dimethyl-5-phenyl-[1,3]dioxane-4,6-dione precipitated from the medium. The reaction was allowed to continue for 10 minutes and cooled. 2,2-dimethyl-5-phenyl-[1,3]dioxane-4,6-dione was isolated by filtration and dried. 67.27 g (60%) 2,2-dimethyl-5-phenyl-[1,3]dioxane-4,6-dione was isolated (m.p. 135-136° C.).

A solution of 25 g (135.1 mmol) N,N-dimethylammonium iodide and 11.91 g (54.1 mmol) 2,2-dimethyl-5-phenyl-[1,3]dioxane-4,6-dione in 585 ml abs. methanol was heated to 65° C. and the reaction was allowed to continue over night at 65° C. The reaction mixture was allowed to cool down to room temperature and the solvent was removed under reduced pressure. The residue was treated with diethyl ether, extracted with a satured $NaHCO_3$ solution and brine and dried over $MgSO_4$. The solvent was removed under reduced pressure and 9.01 g (quant.) of 2-phenyl acrylic acid methyl ester was isolated as a colourless oil. The compound was used without further purification.

A solution of 9.01 g (55.6 mmol) 2-phenyl acrylic acid methyl ester and 4.24 g (50.4 mmol) 3-amino-1,2,4-triazole in 41 ml n-butanol was refluxed for 24 hours. The solvent was removed under reduced pressure. The residue was treated with a small amount of ethanol and diethyl ether and cyclohexane were added. The diethyl ether is slowly removed under reduced pressure. The crude 6-phenyl-5,6,7,8-tetrahydro-[1,2,4]triazolo[4,3-a]pyrimidin-7-on precipitated during evaporation, was isolated by filtration and washed with diethyl ether. 6-phenyl-5,6,7,8-tetrahydro-[1,2,4]triazolo[4,3-a]pyrimidin-7-on was recrystallized from a small amount of ethanol. 2.04 g (19%) 6-phenyl-5,6,7,8-tetrahydro-[1,2,4]triazolo[4,3-a]pyrimidin-7-on was isolated (m.p. 184-186° C.).

Synthesis Example 7

The synthesis of 4,5,6,7-tetrahydro-[1,2,4]triazolo[1,5-a]pyrimidin-5-on (CEC-07)

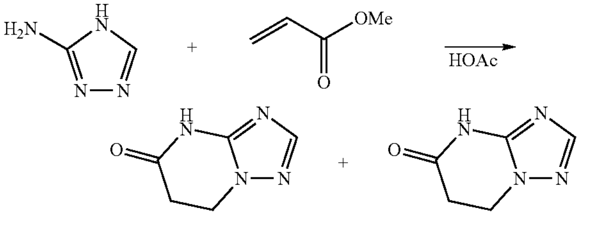

ratio: 4/3

60.00 g (0.68 mol) 95% 3-aminotriazole was dissolved in 715 ml acetic acid. 67.0 ml (64.1 g, 0.74 mol) methyl acrylate was added and the mixture is refluxed for 3 hours. The acetic acid was removed under reduced pressure and the residue was treated with 280 ml methanol. The undissolved residues were removed by filtration and the methanol is removed under reduced pressure. Both isomers were separated by preparative column chromatography on straight phase silica (eluent: a gradient elution from chloroform/methanol 9/1 to chloroform/methanol 2/1). 13.63 g of 4,5,6,7-tetrahydro-[1,2,4]triazolo[1,5-a]pyrimidin-5-on was isolated and recrystallized from water. 3.82 g of the pure isomer 4,5,6,7-tetrahydro-[1,2,4]triazolo[1,5-a]pyrimidin-5-on was isolated.

9.25 g of the other isomer was isolated and twice recrystallized from water. Finally 2.6 g of the isomer was obtained (m.p. 276-80° C.).

Synthesis Example 8

The synthesis of 6-methyl-4,5,6,7-tetrahydro-[1,2,4]triazolo[1,5-a]pyrimidin-5-on (CEC-08)

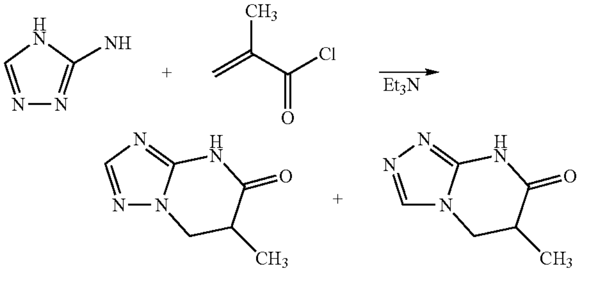

(= CEC-08) (= COMP-01)

33.63 g (0.4 mol) 3-amino-1H-1,2,4-triazole was suspended in 300 ml acetone. 44.44 g (0.44 mol) triethyl amine was added and the mixture was cooled to 0° C. 33.63 g (0.44 mol) methacryloyl chloride was added dropwise over 45 minutes, while the temperature was kept at 0° C. The reaction was allowed to continue at 0° C. for one hour. The precipitated salts were removed by filtration and an additional 10 ml triethyl amine was added to the filtrate. The mixture was refluxed for 18 hours. The precipitated compounds were removed by filtration and the solvent was evaporated under reduced pressure. 6-methyl-4,5,6,7-tetrahydro-[1,2,4]triazolo[1,5-a]pyrimidin-5-on was isolated by preparative column chromatography on a Prochrom LC 80 system, using Kromasil C18 100 Å 10 µm silica and MeOH and an aqueous solution of 0.2% (v/v) triethyl amine and 0.5% (v/v) acetic acid in a 42/58 ratio as eluent, at a flow rate of 150 ml/min. 770 mg of 6-methyl-4,5,6,7-tetrahydro-[1,2,4]triazolo[1,5-a]pyrimidin-5-on was isolated.

The other isomer can also be isolated as comparative compound COMP-01 and can be used in comparative examples.

Synthesis Example 9

The synthesis of 3,4-dihydro-3-methyl-pyrimidino[1,2-a]benzimidazol-2(1H)-one (CEC-09)

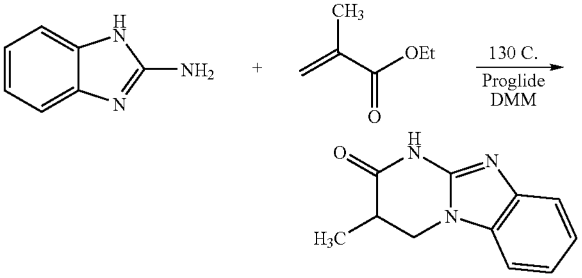

5.326 g (40 mmol) 2-aminobenzimidazole and 4.56 g (40 mmol) ethyl methacrylate were dissolved in 25 ml Proglyde DMM. The reactionmixture is heated to 130° C. The reaction is allowed to continue for 7 hours at 130° C. The reactionmixture is allowed to cool down to room temperature and is added to 250 ml tert-butyl methyl ether. The precipitated 3,4-dihydro-3-methyl-pyrimidino[1,2-a]benzimidazol-2(1H)-one was isolated by filtration and recrystallized from 1-methoxy-2-propanol. 2.7 g (33%) of 3,4-dihydro-3-methyl-pyrimidino[1,2-a]benzimidazol-2(1H)-one was isolated (m.p. >260° C.).

Synthesis Example 10

The synthesis of 3,4-dihydro-pyrimidino[1,2-a]benzimidazol-2(1H)-one (CEC-10)

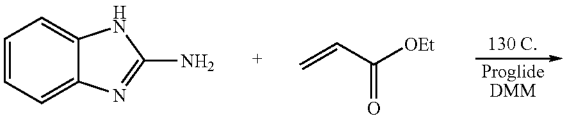

-continued

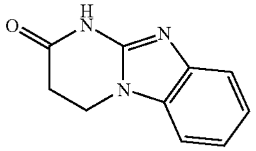

5.32 g (40 mmol) 2-aminobenzimidazole and 4.00 (40 mmol) ethyl acrylate were dissolved in 25 ml Proglyde DMM. The reaction mixture was heated to 130° C. and the reaction was allowed to continue for 6 hours at 130° C. The reaction mixture was allowed to cool down to room temperature. Upon standing over night, 3,4-dihydro-pyrimidino[1,2-a]benzimidazol-2(1H)-one crystallized from the medium and was isolated by filtration. 3,4-dihydro-pyrimidino[1,2-a]benzimidazol-2(1H)-one was recrystallized from 1-methoxy-2-propanol. 4.1 g (54.7%) 3,4-dihydro-pyrimidino[1,2-a]benzimidazol-2(1H)-one was isolated (m.p. >260° C.).

Synthesis Example 11

The synthesis of 3,4-dihydro-3-methyl-pyrimidino[1,2-a]imidazol-2(1H)-one (CEC-11)

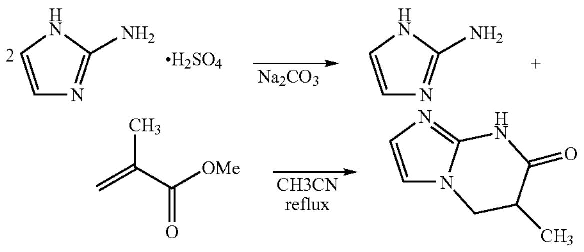

22 g (83 mmol) 2-aminoimidazole sulfate was added to a solution of 8.73 g (83 mmol) $Na_2CO_3$ in 100 ml water. The solution is stirred for 30 minutes and evaporated under reduced pressure. The residue is treated twice with 80 ml methanol. The pooled methanol fractions are evaporated under reduced pressure, yielding 11.7 g of 2-aminoimidazole. 130 ml acetonitrile, 0.36 g BHT and 33.2 g (0.332 mol) methyl methacrylate were added and the mixture was refluxed for 3 hours. The solvent was removed under reduced pressure after cooling down to room temperature. The residue was treated with 25 ml hot water. Upon cooling down to room temperature 3,4-dihydro-3-methyl-pyrimidino[1,2-a]imidazol-2(1H)-one crystallized from the medium. 3,4-dihydro-3-methyl-pyrimidino[1,2-a]imidazol-2(1H)-one was recrystallized from 100 ml 1-methoxy-2-propanol/isopropyl acetate 1/1. 5.4 g (21%) of 3,4-dihydro-3-methyl-pyrimidino[1,2-a]imidazol-2(1H)-one was isolated (m.p. 212° C.).

Synthesis of the SA-Binders SA-BINDER-01 to SA-BINDER-06:

Phenethyl acrylamide can be prepared according to Camail et al. (European Polymer Journal (2000), 36(9), 1853-1863). Benzyl acryl amide is commercially available from Lancaster Synthesis. 4-Methacrylamidobenzenesulfonamide can be prepared according to Hofmann et al. (Makromolekulare Chemie (1976), 177(6), 1791-813).

Synthesis of SA-BINDER-01:

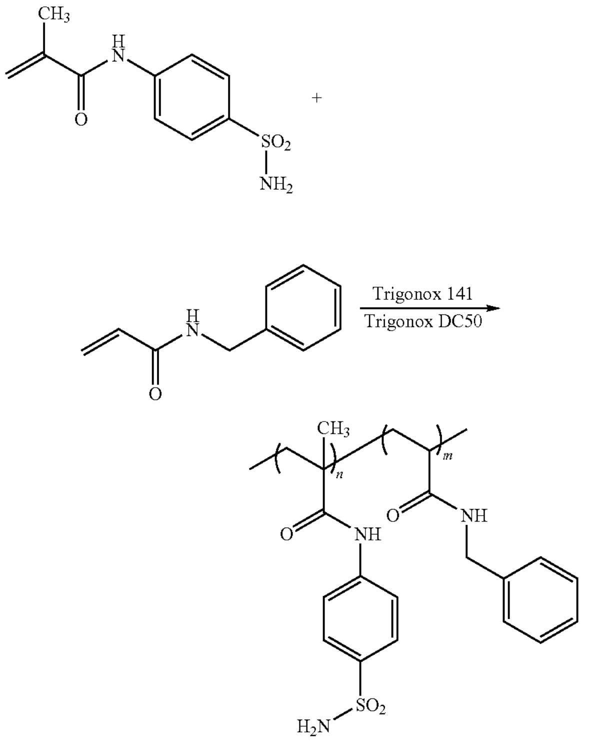

n/m: 40/60

404.8 g butyrolacton was added to 76.9 g (0.32 mol) 4-methacrylamidobenzenesulfonamide and 77.4 g (0.48 mmol) benzyl acrylamide. The mixture was flushed with nitrogen and heated to 140° C., to dissolve all monomers. The mixture was allowed to cool down to 105° C., after complete dissolution of the monomers. 0.93 ml of Trigonox DC50 was added to the mixture, followed by the addition of 12.8 ml of a solution of 3.7 ml Trigonox 141 in 9.1 ml butyrolactone. The reaction mixture was heated to 140° C. and 4.66 ml of Trigonox DC50 was added over two hours. The reaction was allowed to continue for two hours at 140° C. The mixture was cooled to 120° C. and 225 ml 1-methoxy-2-propanol was added. The mixture was allowed to cool down to room temperature. The solution of binder 1 was used as such for the preparation of coating solutions.

Synthesis of SA-BINDER-02:

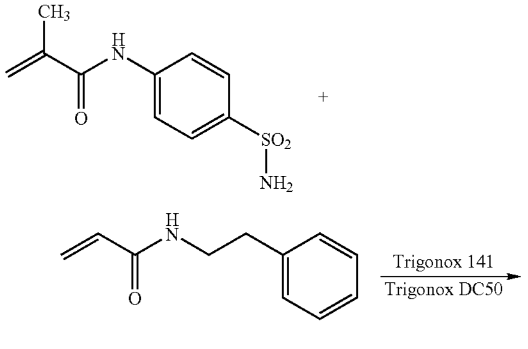

-continued

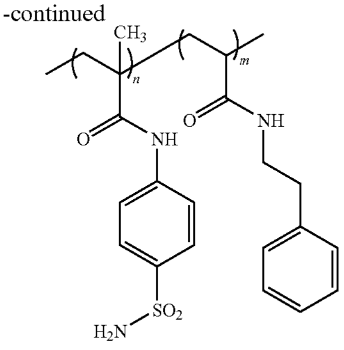

n/m: 60/40

126.5 g butyrolactone was added to 36.04 g (0.15 mol) 4-methacrylamidobenzenesulfonamide and 17.52 g (0.1 mol) phenethyl acrylamide. The mixture was flushed with nitrogen and heated to 140° C. to dissolve all monomers. The mixture is cooled to 120° C. after complete dissolution of all the monomers. 0.291 ml Trigonox DC50 was added to the mixture, followed by the addition of a solution 1.16 ml Trigonox 141 in 2.86 ml butyrolactone. The Trigonox 141 was added at once. The mixture was heated to 140° C. and 1.457 ml Trigonox DC50 was added over two hours. The reaction was allowed to continue for two hours at 140° C. The reaction was cooled to 120° C. and 70.36 ml 1-methoxy-2-propanol was added. The reaction mixture was allowed to cool down to room temperature. The solution of binder 2 was used as such for the preparation of coating solutions.

Synthesis of SA-BINDER-03:

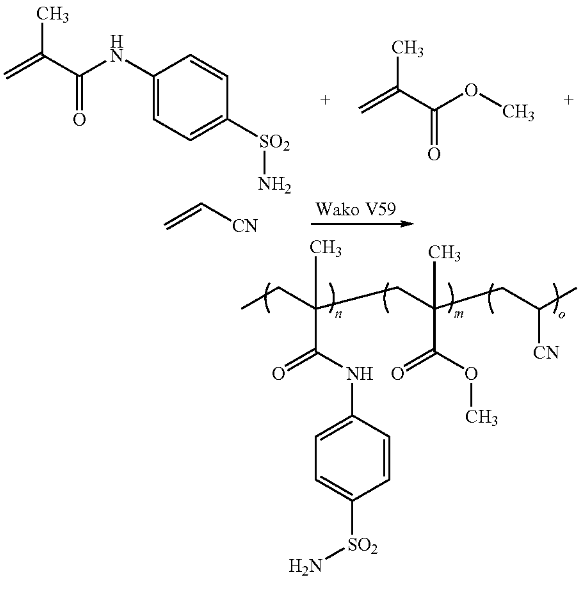

n/m/o: 36/30/34

9.64 g (40 mmol) 4-methacrylamidobenzenesulfonamide, 3.35 g (33.5 mmol) methyl methacrylate and 2.01 g (38 mmol) acrylonitrile were dissolved in 29.6 g dimethyl acetamide. The mixture is heated to 75° C. and a solution of 0.54 g Wako V59 in 10.26 g dimethylacetamide was added. A solution of 9.64 g (40 mmol) 4-methacrylamidobenzenesulfonamide, 3.35 g (33.5 mmol) methyl methacrylate, 2.01 g (38 mmol) acrylonitrile and 0.54 g Wako V59 in 39.86 g dimethyl acetamide was added over two hours, while maintaining the temperature at 75° C. Upon completion of the addition, the reaction was further allowed to continue for an additional two hours at 75° C. 69.5 g of methanol is added and the mixture is allowed to cool down to room temperature. Binder 3 was precipitated in 2 l water, stirred for 30 minutes, isolated by filtration and dried.

Synthesis of SA-BINDER-04:

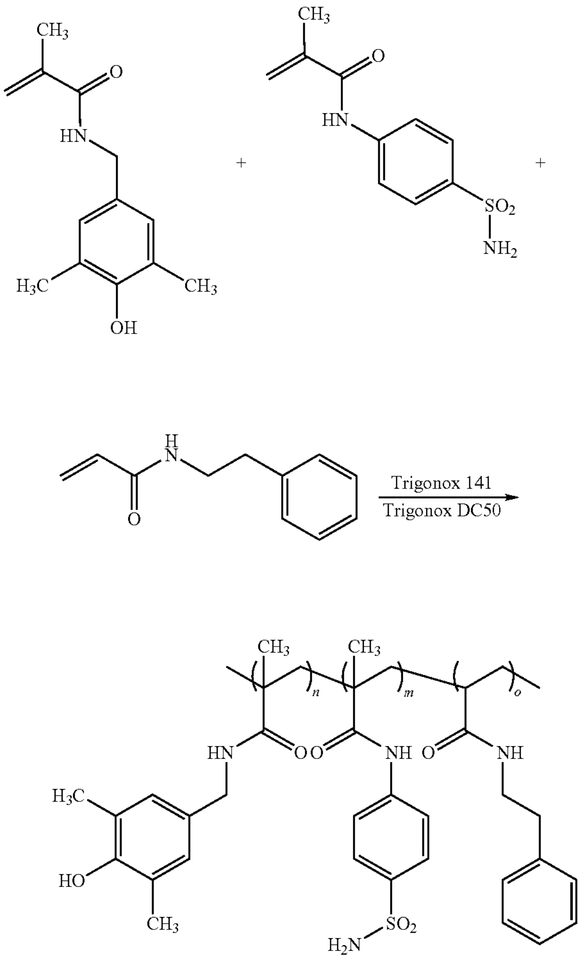

n/m/o: 5/50/45

N-[(4-hydroxy-3,5-dimethylphenyl)methyl]-2-methyl-2-propenamide was prepared according to DE 4126409 A1 (Hoechst A.-G.).

0.8 g (3.5 mmol) N-[(4-hydroxy-3,5-dimethylphenyl)methyl]-2-methyl-2-propenamide, 8.4 g (35 mmol) 4-methacrylamidobenzenesulfonamide and 5.5 g (31.5 mmol) phenethyl acrylamide were dissolved in 31.4 ml butyrolactone at 140° C. and flushed with nitrogen. The mixture was allowed to cool down to 120° C. and 65.6 mg Trigonox DC 50 was added. A solution of 0.3 g Trigonox 141 in 0.9 g butyrolacton was added at once to start the polymerisation. The mixture was heated to 140° C. and 0.328 g Trigonox DC50 was added over two hours. The reaction was allowed to continue for two hours at 140° C. The reaction was cooled to 120° C. and 19.6 ml 1-methoxy-2-propanol was added. The reaction mixture was allowed to cool down to room temperature. The solution of binder 4 was used as such for the preparation of coating solutions.

Synthesis of monomer 2-methyl-2-propenoic acid-2-[[[(1,4-dihydro-6-methyl-4-oxo-2-pyrimidinyl) amino]carbonyl]amino]ethyl ester

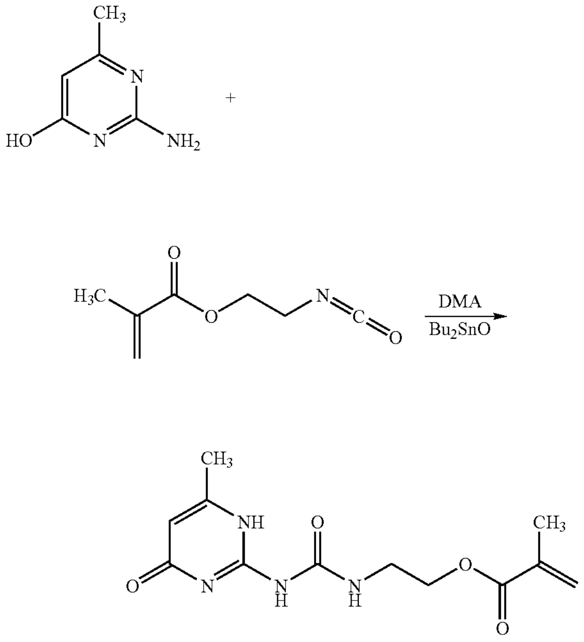

37.5 g (0.3 mol) 6-methylisocytosine, 55.8 g (0.36 mol) 2-isocyanatoethyl methacrylate and 3.7 g (0.015 mmol) dibutyltin oxide were added to 400 ml dimethylacetamide. 100 mg BHT was added and the mixture was heated to 90° C. for one hour. The mixture was filtered at 90° C. Upon cooling down to room temperature 2-methyl-2-propenoic acid-2-[[[(1,4-dihydro-6-methyl-4-oxo-2-pyrimidinyl)amino]carbonyl] amino]ethyl ester started to crystallize. The mixture was stirred for two and a half hour. 500 ml acetone was added and 3-methyl-2-propenoic acid-2-[[[(1,4-dihydro-6-methyl-4-oxo-2-pyrimidinyl)amino]carbonyl]amino]ethyl ester was isolated by filtration. 2-methyl-2-propenoic acid-2-[[[(1,4-dihydro-6-methyl-4-oxo-2-pyrimidinyl)amino]carbonyl] amino]ethyl ester was treated with 500 ml acetone, again isolated by filtration and dried. 68.6 g (82%) of 2-methyl-2-propenoic acid-2-[[[(1,4-dihydro-6-methyl-4-oxo-2-pyrimidinyl)amino]carbonyl]amino]ethyl ester was isolated (m.p.: 208° C.).

Synthesis of SA-BINDER-05:

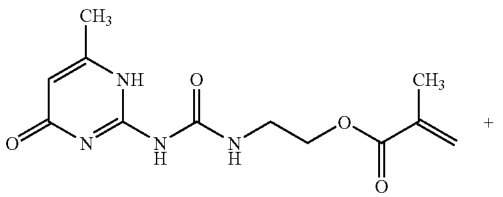

-continued

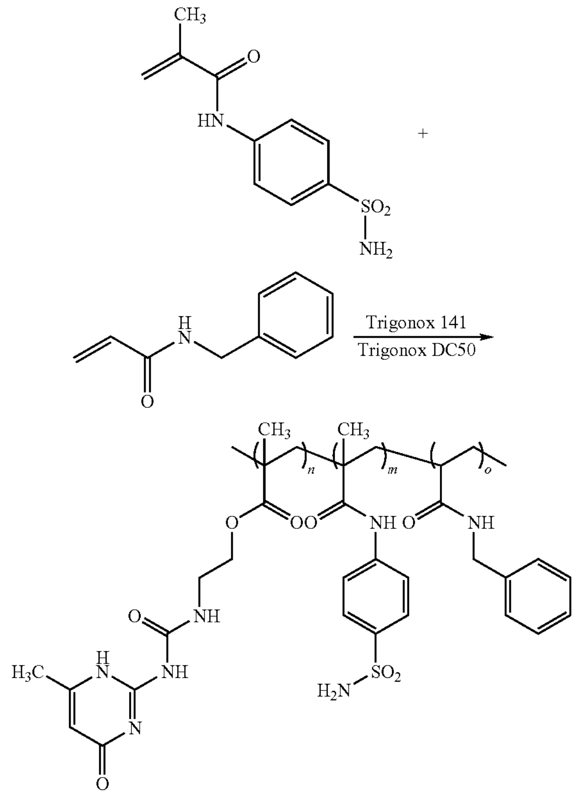

n/m/o: 3/47/50

0.6 g (2.1 mmol), 2-methyl-2-propenoic acid-2-[[[(1,4-dihydro-6-methyl-4-oxo-2-pyrimidinyl)amino]carbonyl] amino]ethyl ester, 7.9 g (33 mmol) 4-methacrylamidobenzenesulfonamide and 5.6 g (35 mmol) benzyl acrylamide were dissolved in 31.4 ml butyrolactone at 140° C. and flushed with nitrogen. The mixture was allowed to cool down to 120° C. and 65.6 mg Trigonox DC 50 was added. A solution of 0.3 g Trigonox 141 in 0.9 g butyrolacton was added at once to start the polymerisation. The mixture was heated to 140° C. and 0.328 g Trigonox DC50 was added over two hours. The reaction was allowed to continue for two hours at 140° C. The reaction was cooled to 120° C. and 19.6 ml 1-methoxy-2-propanol was added. The reaction mixture was allowed to cool down to room temperature. The solution of binder 5 was used as such for the preparation of coating solutions.

Synthesis of SA-BINDER-06:

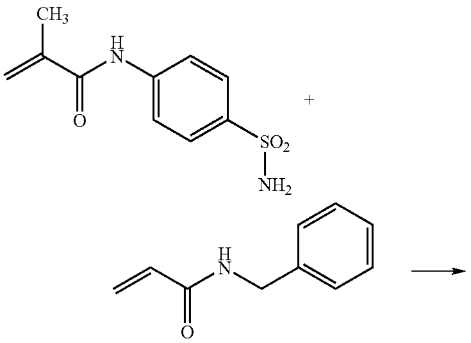

-continued

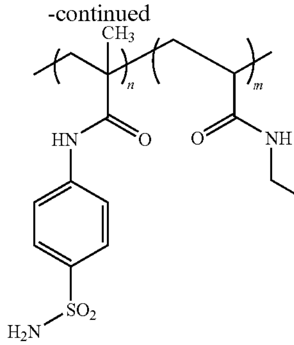

n/m : 47/53

7.95 g (33 mmol) 4-methacrylamidobenzenesulfonamide and 5.93 g (37 mmol) benzyl acrylamide were dissolved in 35.4 g γ-butyrolactone at 140° C. The reaction mixture was cooled down to 110° C. 80 μl Trigonox DC50 was added, immediately followed by the addition of a solution of 0.3 g Trigonox 141 in 0.9 g γ-butyrolactone. The reaction mixture was heated to 140° C. and 401 μl Trigonox DC50 was added over 2 hours. The reaction was allowed to continue for 2 hours at 140° C. The reaction mixture was cooled to 120° C. and 19.6 ml 1-methoxy-2-propanol was added. The reaction mixture was allowed to cool down to room temperature. The solution of binder 6 was used as such for coating.

Determination of the Molecular Weight of the Different SA-Binders:

The molecular weight of the SA-binders, according to the present invention, are determined, using a GPC method. The GPO-columns were calibrated with polystyrene standard delivered by Polymer Labs. A 2× Mixed D column set supplied by Polymer labs was used. Dimethyl acetamide, containing 0.21% (w/w) LiCl and 0.63% (w/w) acetic acid was used as eluent at a flow rate of 1 ml/min and at a column temperature of 40° C. was used. The molecular weight distribution was calculated using a $4^{th}$ order calibration fit.

Preparation of the Lithographic Support S-01.

A 0.30 mm thick aluminum foil was degreased by spraying with an aqueous solution containing 34 g/l of NaOH at 70° C. for 6 seconds and rinsed with demineralised water for 3.6 seconds. The foil was then electrochemically grained during 8 seconds using an alternating current in an aqueous solution containing 12.4 g/l HCl, 9 g/l $SO_4^{2-}$ ions and 5 g/l $Al^{3+}$ ions at a temperature of 37° C. and a current density of 120 A/dm$^2$ (charge density of about 96° C./dm$^2$).

Afterwards, the aluminum foil was desmutted by etching with an aqueous solution containing 145 g/l of sulfuric acid at 80° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and a current density of 25 A/dm$^2$ (charge density of 250 C/dm$^2$), then washed with demineralised water for 7 seconds and post-treated for 4 seconds (by spray) with a solution containing 2.2 g/l of polyvinylphosphonic acid at 70° C., rinsed with demineralised water for 3.5 seconds and dried at 120° C. for 7 seconds.

The support thus obtained was characterized by a surface roughness Ra of 0.5-0.65 μm (measured with interferometyer NT1100) and an anodic weight of about 3.0 g/m$^2$.

Preparation of the Lithographic Support S-02.

A 0.3 mm thick aluminium foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm$^2$ (charge density of about 80° C./dm$^2$). Afterwards, the aluminium foil was desmutted by etching with an aqueous solution containing 145 g/l of sulfuric acid at 80° C. for 5 seconds and rinsed with demineralised water for 4 seconds. The foil was subsequently subjected to anodic oxidation during 10 seconds in an aqueaous solution containing 145 g/l of sulfuric acid at a temperature of 57° C. and a current density of 33 A/dm$^2$ (charge density of 330 C/dm$^2$), then washed with demineralised water for 7 seconds and post-treated for 4 seconds (by spray) with a solution containing 2.2 g/l polyvinylphosphonic acid at 70° C., rinsed with demineralised water for 3.5 seconds and dried at 120° C. for 7 seconds.

The support thus obtained was characterised by a surface roughness Ra of 0.35-0.4 μm (measured with interferometer NT1100) and an anodic weight of 4.0 g/m$^2$.

Invention Examples 1 to 11 and Comparative Examples 1 to 3

Preparation of the Printing Plate Precursors

The printing plate precursors were produced by coating a coating solution onto the above described lithographic support S-01. The coating solution contains the ingredients as defined in Table 1, dissolved in a mixture of the following solvents: 18.5% by volume of tetrahydrofuran, 46.9% by volume of Dowanol PM which is 1-methoxy-2-propanol, commercially available from DOW CHEMICAL Company, and 34.6% by volume of gamma-butyrolactone. The coating was applied at a wet coating thickness of 20 μm and then dried at 135° C. for 3 minutes. The dry coating weight amount in g/m$^2$ of each of the ingredients is indicated in Table 1 and 2.

TABLE 1

Coating composition

| INGREDIENTS | Dry coating weight amount (in g/m$^2$) |
|---|---|
| SA-BINDER-01 | 0.810 |
| SOO94 (1) | 0.021 |
| Crystal Violet (2) | 0.012 |
| Tegoglide 410 (3) | 0.0017 |

a compound in an amount as defined in Table 2

(1) SOO94 is an IR absorbing cyanine dye, commercially available from FEW CHEMICALS; the chemical structure of SOO94 is equal to IR-1 having a tosylate counter ion.

(2) Crystal Violet, commercially available from CIBA-GEIGY.

(3) TEGOGLIDE 410 is a copolymer of polysiloxane and poly(alkylene oxide), commercially available from TEGO CHEMIE SERVICE GmbH.

TABLE 2

Composition and results of the Invention Examples 1 to 11 and Comparative Examples 1 to 3

| Example No. | Compound type | Compound amount (mmol/m$^2$) | Dilution of DEV-01 (%)** | $OD_{min}$ | $OD_{max}$ | ΔOD |
|---|---|---|---|---|---|---|
| Comparative Example 1 | — | — | 74.9 | 0.07 | 0.43 | 0.36 |
| Comparative Example 2 | COMP-01* | 0.53 | 35.7 | 0.03 | 0.45 | 0.42 |
| Comparative Example 3 | COMP-01* | 0.64 | 32.6 | 0.04 | 0.47 | 0.43 |

TABLE 2-continued

Composition and results of the Invention Examples 1 to 11 and Comparative Examples 1 to 3

| Example No. | Compound type | Compound amount ($mmol/m^2$) | Dilution of DEV-01 (%)** | $OD_{min}$ | $OD_{max}$ | ΔOD |
|---|---|---|---|---|---|---|
| Invention Example 1 | CEC-08 | 0.53 | 45.5 | 0.03 | 0.55 | 0.52 |
| Invention Example 2 | CEC-08 | 0.64 | 39.7 | 0.04 | 0.72 | 0.68 |
| Invention Example 3 | CEC-03 | 0.39 | 66.1 | 0.05 | 0.69 | 0.64 |
| Invention Example 4 | CEC-04 | 0.51 | 63.9 | 0.03 | 0.63 | 0.60 |
| Invention Example 5 | CEC-06 | 0.45 | 54.6 | 0.04 | 0.55 | 0.51 |
| Invention Example 6 | CEC-07 | 0.70 | 39.3 | 0.05 | 0.69 | 0.64 |
| Invention Example 7 | CEC-09 | 0.48 | 56.9 | 0.05 | 0.55 | 0.50 |
| Invention Example 8 | CEC-10 | 0.52 | 48.2 | 0.05 | 0.56 | 0.51 |
| Invention Example 9 | CEC-11 | 0.64 | 53.5 | 0.03 | 0.63 | 0.60 |
| Invention Example 10 | CEC-14 | 0.62 | 83.4 | 0.04 | 0.60 | 0.56 |
| Invention Example 11 | CEC-26 | 0.30 | 96.5 | 0.05 | 0.62 | 0.57 |

*COMP-01 is a comparative compound, having the structure of

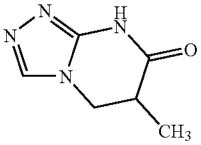

**The value in % means the concentration of the developing solution (after dilution) in per cent related to undiluted (=100%) DEV-01 (e.g. 74.9% means that DEV-01 (=100%) is diluted for 25.1% with water upto a concentration of 74.9%).

TABLE 3

Composition of the developing solution DEV-01

| INGREDIENTS | DEV-01 (g) |
|---|---|
| Na-glucoheptanoate (1) | 5 |
| Na-metasilicate (2) | 102 |
| Na-silicate solution (3) | 10 |
| Variquat cc 9NS (4) | 0.044 |
| Triton H-66 (5) | 5.8 |
| Synperonic T304 (6) | 0.141 |
| Water until | 1000 |
| Conductivity, measured at 25° C. (mS/cm) | 75.4 |

(1) Na-glucoheptanoate is glucoheptanoate sodium salt (2) Na-metasilicate is sodium metasilicate pentahydrate, commercially available from SILMACO NV (3) Na-silicate solution is a solution (40% by weight) of Sodium Water Glass 37/40, commercially available from CALDIC CHEMIE NV (4) Variquat cc 9NS is a cationic surfactant, commercially available from GOLDSCHMIDT (5) Triton H-66 is an anionic surfactant, commercially available from SEPULCHRE (6) Synperonic T304 is a block-co-polymer of polyethylene oxide (=PEO) and polypropylene oxide (=PPO) attached to ethylenediamine (=EDA) in a ratio EDA/PEO/PPO of 1/15/14 and having a mean molecular weight of 1600, commercially available from UNIQEMA.

Imaging

The printing plate precursors were exposed with a Creo Trendsetter 3244 (plate-setter, trademark from CREO, Barnaby, Canada), having a 20 W thermal head, operating at 150 rpm and an energy density of 140 $mJ/cm^2$.

Developing Conditions and Results

The precursors of the present invention as defined in Table 1 and 2 exhibit an improved lithographic contrast after processing, i.e. the difference between the optical density at the non-exposed areas ($OD_{max}$) and the exposed areas ($OD_{min}$), hereinafter also referred to as "ΔOD" or "$OD_{max}$−$OD_{min}$", needs to be as high as possible and the $OD_{min}$ needs also to be as low as possible in order to exhibit a high printing performance and to avoid stain on the plate or toning during the printing process. The optical density (OD) of the coating remaining at the plate was measured with a GretagMacbeth D19C densitometer, commercially available from Gretag-Macbeth AG, with the uncoated support as reference. The precursors as described in the examples have a different composition and show different dissolution kinetics in the alkaline developing solution. In order to be able to compare the different precursors it is desirable that the dissolution behaviour of these different precursors is comparable and, therefore, the developing force, i.e. is the amount of alkali in the developer, is adapted for each precursor in order to have comparable dissolution kinetics. Therefore, the dilution of the developing solution is determined for each precursor by the following method.

Method for determining the reference solution of the developer: The image-wise exposed precursor is developed by dipping the precursor in the developer DEV-01, as defined in Table 3, at a temperature of 25° C. during a dwell time of 10 seconds and measuring the $OD_{max}$ and $OD_{min}$ values. This processing step is repeated for several times, at each time the developer is diluted more and more with water (e.g. dilutions with an increment of 5 or 10% by weight with water). In this way the dilution degree whereby the $OD_{min}$ value is increased until an OD-value is obtained, equal to 40% of the $OD_{max}$ value. At this point of dilution, the developing solution is defined as the reference solution.

The image-wise exposed precursor is developed by dipping the precursor in this reference solution at a temperature of 25° C. during a dwell time of 60 seconds, and the $OD_{max}$ and $OD_{min}$ values obtained under these processing conditions are indicated in Table 2.

In accordance with the present invention, the lithographic contrast as defined under these processing conditions by the difference between the optical density at the non-exposed areas ($OD_{max}$) and the exposed areas ($OD_{min}$) is at least 0.50, and the $OD_{min}$ value at the exposed areas as defined under these processing conditions is at most 0.06.

The results in Table 2 demonstrate that the precursors comprising a CEC according to the present invention exhibit an improved lithographic contrast of at least 0.50 and a $OD_{min}$ value of at most 0.06 in comparison with the comparative examples which do not contain a CEC of the present invention.

Invention Examples 12 to 17 and Comparative Example 4

Preparation of the Printing Plate Precursors

The printing plate precursors were produced in the same way as described above in Table 1, with the exception that the added compounds are defined in Table 4 instead of in Table 2. The composition of the Invention Examples 12 to 17 and of the Comparative Example 4 are given in Table 4.

The reference developing solution in order to obtain comparable dissolution kinetics for the different precursors is determined here in a different way than described in the Invention Example 1. Instead of diluting the developing solution (until a value for $OD_{min}$ is obtained equal to 40% of the $OD_{max}$ value) as explained above, here, the developing solution DEV-02, having a conductivity of $17.10^{-3}$ S/cm (hereinafter also referred too as "17 mS/cm") (see composition in Table 5) is concentrated progressively by adding a solution of 50% by weight of KOH in small amounts until the exposed precursor shows a value for $OD_{min}$ of 40% of the $OD_{max}$ value. In Table 4 the conductivity of the reference developing solution, also referred to as "RDS", after concentration with KOH is indicated.

The image-wise exposed precursor is developed by dipping the precursor in this reference solution at a temperature of 25° C. during a dwell time of 60 seconds, and the $OD_{max}$ and $OD_{min}$ values obtained under these processing conditions are indicated in Table 4.

TABLE 4

Composition and results of the Invention Examples 12 to 17 and Comparative Example 4

| Example No. | Compound type | Compound amount (mmol/$m^2$) | Conductivity of RDS (mS/cm) | $OD_{min}$ | $OD_{max}$ | ΔOD |
|---|---|---|---|---|---|---|
| Comparative Example 4 | — | — | 53.5 | 0.09 | 0.61 | 0.52 |
| Invention Example 12 | CEC-03 | 0.30 | 52.2 | 0.05 | 0.67 | 0.62 |
| Invention Example 13 | CEC-03 | 0.40 | 49.9 | 0.06 | 0.71 | 0.65 |
| Invention Example 14 | CEC-04 | 0.30 | 49.0 | 0.04 | 0.67 | 0.63 |
| Invention Example 15 | CEC-04 | 0.40 | 46.6 | 0.04 | 0.72 | 0.68 |
| Invention Example 16 | CEC-06 | 0.30 | 47.2 | 0.05 | 0.58 | 0.53 |
| Invention Example 17 | CEC-06 | 0.40 | 42.7 | 0.06 | 0.66 | 0.60 |

TABLE 5

Composition of the developing solution DEV-02

| INGREDIENTS | DEV-02 (g) |
|---|---|
| Sorbitol (1) | 67.3 |
| K-citrate (2) | 12.75 |
| Mackam 2CSF (3) | 0.3 |
| Synperonic T304 (4) | 1.025 |
| Dequest 2060S (5) | 0.11 |
| Surfynol 104H (6) | 0.17 |

TABLE 5-continued

Composition of the developing solution DEV-02

| INGREDIENTS | DEV-02 (g) |
|---|---|
| KOH (aqueous solution 50% by weight) | 5.24 |
| Water until | 1000 |
| Conductivity, measured at 25° C. (mS/cm) | 17 |

(1) Sorbitol has the structure of

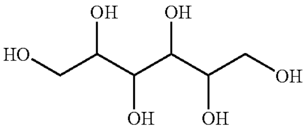

commercially available from ROQUETTE FRERES SA (2) K-citrate represents tri-potassium citrate monohydrate, commercially available from MERCK (3) Mackam 2CSF has the structure of

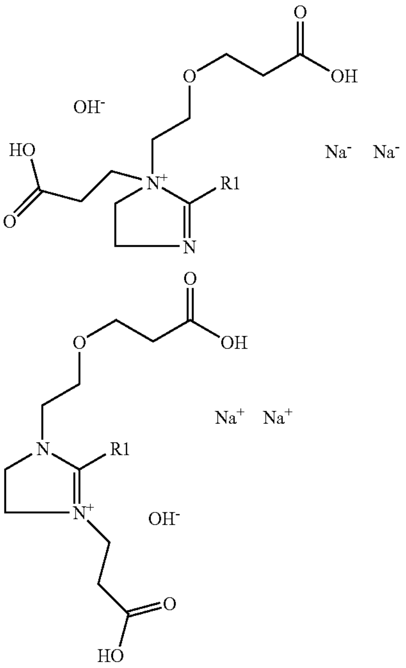

commercially available from CALDIC CHEMIE NV (4) Synperonic T304 is a block-co-polymer of polyethylene oxid (=PEO) and polypropylene oxide (=PPO) attached to ethylenediamine (=EDA) in a ratio EDA/PEO/PPO of 1/15/14 and having a mean molecular weight of 1600, commercially available from UNIQEMA (5) Dequest 2060S has the structure of

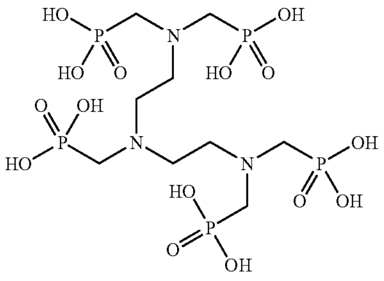

commercially available from MONSANTO SOLUTIA EUROPE

TABLE 5-continued

| Composition of the developing solution DEV-02 | |
|---|---|
| INGREDIENTS | DEV-02 (g) |

(6) Surfynol 104H is a surfactant having the structure of

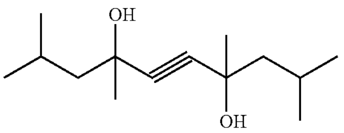

commercially available from KEYSER & MACKAY, supplied by AIR PRODUCTS & CHEMICALS.

Imaging

The printing plate precursors are exposed in an analogue way as described above in Invention Example 1.

Developing Conditions and Results

The precursors are developed in an analogue way as described above for Invention Example 1, with the exception that the reference developing solution is a concentrated DEV-02 as defined in Table 5. The results are summarized in Table 4.

The results in Table 4 demonstrate that the precursors comprising a CEC according to the present invention exhibit an improved lithographic contrast of at least 0.50 and a $OD_{min}$ value of at most 0.06 in comparison with the comparative example which do not contain a CEC of the present invention.

Invention Examples 18 to 21 and Comparative Examples 5 and 6

Preparation of the Printing Plate Precursors

The printing plate precursors were produced in the same way as described above in Table 1, with the exception that the binder SA-BINDER-02 is used instead of SA-BINDER-01 in Table 1, that a mixture of 53% by volume of tetrahydrofuran, 20% by volume of Dowanol PM and 27% by volume of gamma-butyrolactone is used instead of the solvent mixture as defined in Invention Example 1 and that the compounds are added as defined in Table 6 instead of Table 2. The composition of the Invention Examples 18 to 21 and of the Comparative Examples 5 and 6 are given in Table 6.

The printing plate precursors are exposed in an analogues way as described above in Invention Example 1.

The precursors are developed with RDS in an analogue way as described above for Invention Example 12. The results are summarized in Table 6.

TABLE 6

Composition and results of the Invention Examples 18 to 21 and Comparative Examples 5 and 6

| Example No. | Compound type | Compound amount (mmol/$m^2$) | Conductivity of RDS (mS/cm) | $OD_{min}$ | $OD_{max}$ | ΔOD |
|---|---|---|---|---|---|---|
| Comparative Example 5 | — | — | 40.3 | 0.13 | 0.69 | 0.56 |
| Comparative Example 6 | COMP-01* | 1.06 | 25.9 | 0.04 | 0.32 | 0.28 |
| Invention Example 18 | CEC-03 | 0.66 | 34.9 | 0.06 | 0.61 | 0.55 |
| Invention Example 19 | CEC-04 | 0.85 | 28.8 | 0.01 | 0.81 | 0.80 |

TABLE 6-continued

Composition and results of the Invention Examples 18 to 21 and Comparative Examples 5 and 6

| Example No. | Compound type | Compound amount (mmol/$m^2$) | Conductivity of RDS (mS/cm) | $OD_{min}$ | $OD_{max}$ | ΔOD |
|---|---|---|---|---|---|---|
| Invention Example 20 | CEC-11 | 0.86 | 29.4 | 0.06 | 0.79 | 0.73 |
| Invention Example 21 | CEC-11 | 1.07 | 27.1 | 0.03 | 0.78 | 0.75 |

*see Table 2.

The results in Table 6 demonstrate that the precursors comprising a CEC according to the present invention exhibit an improved lithographic contrast of at least 0.50 and a $OD_{min}$ value of at most 0.06 in comparison with the comparative example which do not contain a CEC of the present invention.

Invention Example 22 and Comparative Example 7

Preparation of the Printing Plate Precursors

The printing plate precursors were produced in the same way as described above in Table 1, with the exception that the binder SA-BINDER-04 is used instead of SA-BINDER-01 in Table 1, that a mixture of 53% by volume of tetrahydrofuran, 20% by volume of Dowanol PM and 27% by volume of gamma-butyrolactone is used instead of the solvent mixture as defined in Invention Example 1, that the compound CEC-11 is added as defined in Table 7 instead of Table 2 and that the support S-02 is used instead of S-01. The composition of the Invention Example 22 and of the Comparative Example 7 are given in Table 7.

The printing plate precursors are exposed in an analogue way as described above in Invention Example 1.

The precursors are developed with RDS in an analogue way as described above for Invention Example 12. The results are summarized in Table 7.

TABLE 7

Composition and results of the Invention Example 22 and Comparative Example 7

| Example No. | Compound type | Compound amount (mmol/$m^2$) | Conductivity of RDS (mS/cm) | $OD_{min}$ | $OD_{max}$ | ΔOD |
|---|---|---|---|---|---|---|
| Comparative Example 7 | — | — | 46.2 | 0.14 | 0.74 | 0.60 |
| Invention Example 22 | CEC-11 | 0.86 | 35.2 | 0.04 | 0.85 | 0.81 |

The results in Table 7 demonstrate that the precursors comprising a CEC according to the present invention exhibit an improved lithographic contrast of at least 0.50 and a $OD_{min}$ value of at most 0.06 in comparison with the comparative example which do not contain a CEC of the present invention.

Invention Example 23 and Comparative Example 8

Preparation of the Printing Plate Precursors

The printing plate precursors were produced in the same way as described above in Table 1, with the exception that the binder SA-BINDER-05 is used instead of SA-BINDER-01 in Table 1, that a mixture of 53% by volume of tetrahydrofuran, 20% by volume of Dowanol PM and 27% by volume of gamma-butyrolactone is used instead of the solvent mixture as defined in Invention Example 1, that the compound CEC-11 is added as defined in Table 8 instead of Table 2 and that the support S-02 is used instead of S-01. The composition of the Invention Example 23 and of the Comparative Example 8 are given in Table 8.

The printing plate precursors are exposed in an analogue way as described above in Invention Example 1.

The precursors are developed with RDS in an analogue way as described above for Invention Example 12. The results are summarized in Table 8.

TABLE 8

Composition and results of the Invention Example 23 and Comparative Example 8

| Example No. | Compound type | Compound amount (mmol/m$^2$) | Conductivity of RDS (mS/cm) | $OD_{min}$ | $OD_{max}$ | ΔOD |
|---|---|---|---|---|---|---|
| Comparative Example 8 | — | — | 39.3 | 0.11 | 0.61 | 0.50 |
| Invention Example 23 | CEC-11 | 0.86 | 27.6 | 0.04 | 0.81 | 0.77 |

The results in Table 8 demonstrate that the precursors comprising a CEC according to the present invention exhibit an improved lithographic contrast of at least 0.50 and a $OD_{min}$ value of at most 0.06 in comparison with the comparative example which do not contain a CEC of the present invention.

Invention Examples 24 and 25 and Comparative Example 9

Preparation of the Printing Plate Precursors

The printing plate precursors were produced in the same way as described above in Table 1, with the exception that the binder SA-BINDER-06 is used instead of SA-BINDER-01 in Table 1, that a mixture of 53% by volume of tetrahydrofuran, 20 by volume of Dowanol PM and 27% by volume of gamma-butyrolactone is used instead of the solvent mixture as defined in Invention Example 1, that the compound CEC-11 is added as defined in Table 9 instead of Table 2 and that the support S-02 is used instead of S-01. The composition of the Invention Examples 24 and 25 and of the Comparative Example 9 are given in Table 9.

The printing plate precursors are exposed in an analogue way as described above in Invention Example 1.

The precursors are developed with RDS in an analogue way as described above for Invention Example 12. The results are summarized in Table 9.

TABLE 9

Composition and results of the Invention Examples 24 and 25 and Comparative Example 9

| Example No. | Compound type | Compound amount (mmol/m$^2$) | Conductivity of RDS (mS/cm) | $OD_{min}$ | $OD_{max}$ | ΔOD |
|---|---|---|---|---|---|---|
| Comparative Example 9 | — | — | 45.2 | 0.06 | 0.53 | 0.47 |
| Invention Example 24 | CEC-11 | 0.12 | 45.2 | 0.05 | 0.56 | 0.51 |
| Invention Example 25 | CEC-11 | 0.60 | 37.8 | 0.06 | 0.77 | 0.71 |

The results in Table 9 demonstrate that the precursors comprising a CEC according to the present invention exhibit an improved lithographic contrast of at least 0.50 and a $OD_{min}$ value of at most 0.06 in comparison with the comparative example which do not contain a CEC of the present invention.

Invention Examples 26 to 30 and Comparative Example 10

Preparation of the Printing Plate Precursors

The printing plate precursors comprise two layers and were produced by first applying a first coating layer as defined in Table 1 onto the above described lithographic support S-01 or S-02 as specified in Table 10, with the exception that SA-BINDER-03 is used instead of SA-BINDER-01 and that no further compound was added to the coating solution. The coating solution contains the other ingredients as defined in Table 1, dissolved in a mixture of 35.3 by volume of 2-butanone, 41.5% by volume of Dowanol PM and 23.2% by volume of gamma-butyrolactone. The coating was applied at a wet coating thickness of 20 μm and then dried at 135° C. for 3 minutes. The dry coating weight amount in g/m$^2$ of each of the ingredients is the same or in correspondence with the values of Table 1.

On the first coated layer, a second layer having the composition as defined in Table 1 and Table 10 was further applied, with the exception that SA-BINDER-02 is used instead of SA-BINDER-01 and that the compound added to the coating solution is defined in Table 10. The coating solution contains the ingredients as defined in Table 1 and 10, dissolved in a mixture of 53% by volume of tetrahydrofuran, 20% by volume of Dowanol PM and 27% by volume of gamma-butyrolactone. The coating was applied at a wet coating thickness of 16 μm and then dried at 135° C. for 3 minutes. The dry coating weight amount in g/m$^2$ of each of the ingredients is the same or in correspondence with the values of Table 1.

The printing plate precursors are exposed in an analogue way as described above in Invention Example 1.

The precursors are developed with RDS in an analogue way as described above for Invention Example 12. The results are summarized in Table 10.

TABLE 10

Composition and results of the Invention Examples 26 and 27

| Example No. | Support type | CEC type | Amount CEC ($mmol/m^2$) | Conductivity of RDS (mS/cm) | $OD_{min}$ | $OD_{max}$ | $\Delta OD$ |
|---|---|---|---|---|---|---|---|
| Comparative Example 10 | S-02 | — | — | 58.8 | 0.02 | 0.07 | 0.05 |
| Invention Example 26 | S-02 | CEC-07 | 1.17 | 33.7 | 0.02 | 1.19 | 1.17 |
| Invention Example 27 | S-02 | CEC-07 | 1.76 | 33.3 | 0.02 | 1.13 | 1.11 |
| Invention Example 28 | S-01 | CEC-08 | 1.06 | 40.5 | 0.0 | 0.83 | 0.83 |
| Invention Example 29 | S-01 | CEC-08 | 1.60 | 31.5 | 0.0 | 0.99 | 0.99 |
| Invention Example 30 | S-02 | CEC-12 | 1.10 | 31.4 | 0.02 | 0.64 | 0.62 |

The results in Table 10 demonstrate that the precursors comprising a CEC according to the present invention exhibit an is improved lithographic contrast of at least 0.50 and a $OD_{min}$ value of at most 0.06 in comparison with the comparative example which do not contain a CEC of the present invention.

The invention claimed is:

1. A lithographic printing plate precursor comprising a support which includes a hydrophilic surface or which is provided with a hydrophilic layer and a coating thereon, said coating comprising an IR absorbing agent, a contrast enhancing compound and a polymeric binder that alters its solubility in an alkaline developing solution upon exposure, wherein said contrast enhancing compound has the structure of formula I:

(I)

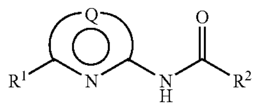

wherein $R^1$ is hydrogen, an optionally substituted alkyl, alkenyl, alkynyl, aryl, alkaryl, aralkyl or heteroaryl group, halogen, $—NR^4R^5$, $—CO—NR^4R^5$, $—SO_2—NR^4R^5$, $—COR^6$, —CN, $—NO_2$, $—COOR^6$, $—OR^3$, $—SR^3$, $—SOR^3$, $—SO_2R^6$, $—SO_3R^6$, $—PO_4R^4R^5$, $—PO_3R^4R^5$, $—NR^6—CO—NR^4R^5$, $—O—COOR^6$, $—NR^4—COOR^5$, $—NR^4—CO—R^5$ or a phosphoramidate group;

$R^2$ is hydrogen, an optionally substituted alkyl, alkenyl, alkynyl, aryl, alkaryl, aralkyl or heteroaryl group, halogen, $—SO_2—NR^4R^5$, —CN, $—NO_2$, $—SOR^3$, $—SO_2R^6$, $—SO_3R^6$, $—PO_4R^4R^5$, $—PO_3R^4R^5$ or a phosphoramidate group;

$R^3$ is an optionally substituted alkyl, alkenyl, alkynyl, aryl, alkaryl, aralkyl or heteroaryl group;

$R^4$, $R^5$ and $R^6$ independently are hydrogen or one of the groups as defined for $R^3$, or wherein two groups selected from the group consisting of $R^4$, $R^5$ and $R^6$ together comprise the atoms necessary to form a ring;

Q is one of the following groups which forms an optionally substituted 6 membered heteroaromatic ring, said groups being selected from the group consisting of $**—C(T^2)\text{-}N—N—*$, $**—N—N—C(T^2)\text{-}*$, $**—N—C(T^2)\text{-}C(T^3)\text{-}*$, $**—C(T^2)\text{-}N—C(T^3)\text{-}*$, $**—C(T^2)\text{-}C(T^3)\text{-}C(T^4)\text{-}*$, $**—C(T^2)\text{-}C(T^1)\text{-}N—*$, $**—N—C(T^1)\text{-}N—*$ and $**—N—N—N—*$, or Q is one of the following groups which forms an optionally substituted 5 membered heteroaromatic ring, said groups being selected from the group consisting of $**—C(T^1)\text{-}N(T^2)\text{-}*$, $**—C(T^2)\text{-}S—*$, $**—C(T^2)\text{-}O—*$, $**—N—N(T^2)\text{-}*$, $**—N—S—*$, $**—N—O—*$, $**—N(T^2)\text{-}C(T^3)\text{-}*$, $**—S—N—*$ and $**—O—N—*$, wherein

* indicates a binding site to the carbon atom between the two nitrogen atoms and ** indicates a binding site to the carbon atom substituted by $R^1$; and wherein the symbol "O" in the middle of the ring comprising Q represents the pi-electrons necessary for the aromatic ring;

$T^1$ is one of the groups as defined for $R^1$;

$T^2$, $T^3$ and $T^4$ independently are one of the groups as defined for $R^2$; or wherein one of the groups of $T^1$, $T^2$, $T^3$ and $T^4$ together with one of the groups of $R^1$ comprise the atoms necessary to form a ring; or wherein one of the groups of $T^1$, $T^2$, $T^3$ and $T^4$ together with one of the groups of $R^2$ comprise the atoms necessary to form a ring; or wherein two groups, selected from the group consisting of $T^1$, $T^2$, $T^3$ and $T^4$, comprise the atoms necessary to form a ring.

2. The lithographic printing plate precursor according to claim 1, wherein said binder is a polymer comprising a sulphonamide group.

3. The lithographic printing plate precursor according to claim 2, wherein said sulphonamide group is present in the side chain of said polymer.

4. The lithographic printing plate precursor according to claim 1, wherein said binder is a phenolic resin.

5. A lithographic printing plate precursor comprising a support which includes a hydrophilic surface or which is provided with a hydrophilic layer and a coating thereon, said coating comprising an IR absorbing agent, a contrast enhancing compound and a polymeric binder that alters its solubility in an alkaline developing solution upon exposure, wherein said contrast enhancing compound has the structure of formula III:

(III)

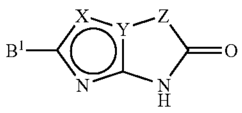

wherein

Y is a nitrogen atom or a carbon atom;

X is the atom or group of atoms necessary to form an optionally-substituted five- or six-membered heteroaromatic ring;

Z is the atom or group of atoms necessary to form an optionally-substituted five- to eight-membered ring;

$B^1$ is hydrogen, an optionally substituted alkyl, alkenyl, alkynyl, aryl, alkaryl, aralkyl or heteroaryl group, halogen, $—NR^4R^5$, $—CO—NR^4R^5$, $—SO_2—NR^4R^5$, $—COR^6$, —CN, $—NO_2$, $—COOR^6$, $—OR^3$, $—SR^3$, $—SOR^3$, $—SO_2R^6$, $—SO_3R^6$, $—PO_4R^4R^5$, $—PO_3R^4R^5$, $—NR^6—CO—NR^4R^5$, $—O—COOR^6$, $—NR^4—COOR^5$, $—NR^4—CO—R^5$ or a phosphoramidate group; $R^3$ is an optionally substituted alkyl, alkenyl, alkynyl, aryl, alkaryl, aralkyl or heteroaryl group; $R^4$, $R^5$ and $R^6$ independently are hydrogen or one of the groups as defined for $R^3$, or wherein two groups selected from the group consisting of $R^4$, $R^5$ and $R^6$ together comprise the atoms necessary to form a ring; and the symbol "O" in the middle of the ring comprising X and Y represents a number of pi-electrons necessary for the aromatic ring.

6. A lithographic printing plate precursor comprising a support which includes a hydrophilic surface or which is provided with a hydrophilic layer and a coating thereon, said coating comprising an IR absorbing agent, a contrast enhancing compound and a polymeric binder that alters its solubility in an alkaline developing upon exposure, wherein said contrast enhancing compound has the structure of formula IV (IV)

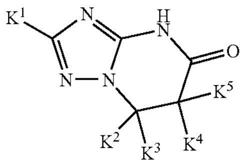

wherein $K^1$ is hydrogen, an optionally substituted alkyl, alkenyl, alkynyl, aryl, alkaryl, aralkyl or heteroaryl group, halogen, $—NR^4R^5$, $—CO—NR^4R^5$, $—SO_2—NR^4R^5$, $—COR^6$, —CN, $—NO_2$, $—COOR^6$, $—OR^3$, $—SR^3$, $—SOR^3$, $—SO_2R^6$, $—SO_3R^6$, $—PO_4R^4R^5$, $—PO_3R^4R^5$, $—NR^6—CO—NR^4R^5$, $—O—COOR^6$, $—NR^4—COOR^5$, $—NR^4—CO—R^5$ or a phosphoramidate group; $R^3$ is an optionally substituted alkyl, alkenyl, alkynyl, aryl, alkaryl, aralkyl or heteroaryl group; $R^4$, $R^5$ and $R^6$ independently are hydrogen or one of the groups as defined for $R^3$, or wherein two groups selected from the group consisting of $R^4$, $R^5$ and $R^6$ together comprise the atoms necessary to form a ring; and $K^2$ to $K^5$ independently are hydrogen, $—NR^4R^5$, $—CO—NR^4R^5$, $—COR^6$, $—COOR^6$, $—OR^3$, $—NR^6—CO—NR^4R^5$, $—NR^4—COOR^5$, or $—NR^4—CO—R^5$, or wherein two groups selected from the group consisting of $K^2$, $K^3$, $K^4$ and $K^5$ together comprise the atoms necessary to form a ring.

7. A lithographic printing plate precursor comprising a support which includes a hydrophilic surface or which is provided with a hydrophilic layer and a coating thereon, said coating comprising an IR absorbing agent, a contrast enhancing compound and a polymeric binder that alters its solubility in an alkaline developing solution upon exposure, wherein said contrast enhancing compound has the structure of formula V (V)

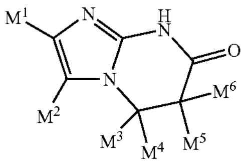

wherein $M^1$ is hydrogen, an optionally substituted alkyl, alkenyl, alkynyl, aryl, alkaryl, aralkyl or heteroaryl group, halogen, $—NR^4R^5$, $—CO—NR^4R^5$, $—SO_2—NR^4R^5$, $—COR^6$, —CN, $—NO_2$, $—COOR^6$, $—OR^3$, $—SR^3$, $—SOR^3$, $—SO_2R^6$, $—SO_3R^6$, $—PO_4R^4R^5$, $—PO_3R^4R^5$, $—NR^6—CO—NR^4R^5$, $—O—COOR^6$, $—NR^4—COOR^5$, $—NR^4—CO—R^5$ or a phosphoramidate group $R^3$ is an optionally substituted alkyl, alkenyl, alkenyl, aryl, alkaryl, aralkyl or heteroaryl group; $R^4$, $R^5$ and $R^6$ independently are hydrogen or one of the groups as defined for $R^3$, or wherein two groups selected from the group consisting of $R^4$, $R^5$ and $R^6$ together comprise the atoms necessary to form a ring; and $M^2$ to $M^6$ independently are hydrogen, $—NR^4R^5$, $—CO—NR^4R^5$, $—COR^6$, $—COOR^6$, $—OR^3$, $—NR^6—CO—NR^4R^5$, $—NR^4—COOR^5$, $—NR^4—CO—R^5$, or are one of $R^3$, $R^4$, $R^5$ and $R^6$; or wherein $M^1$ and $M^2$ together comprise the atoms necessary to form a ring; or wherein two groups, selected from the group consisting of $M^2$ to $M^6$, together comprise the atoms necessary to form a ring.

8. A lithographic printing plate precursor comprising a support which includes a hydrophilic surface or which is provided with a hydrophilic layer and a coating thereon, said coating comprising an IR absorbing agent, a contrast enhancing compound and a polymeric binder that alters its solubility in an alkaline developing solution upon exposure, wherein said contrast enhancing compound has the structure of formula VI (VI)

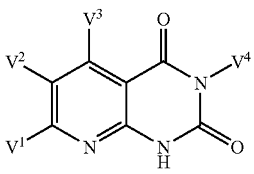

wherein $V^1$ is hydrogen, an optionally substituted alkyl, alkenyl, alkynyl, aryl, alkaryl, aralkyl or heteroaryl group, halogen, $—NR^4R^5$, $—CO—NR^4R^5$, $—SO_2—NR^4R^5$, —$COR^6$, —CN, —$NO_2$, —$COOR^6$, —$OR^3$, —$SR^3$, —$SOR^3$, —$SO_2R^6$, —$SO_3R^6$, —$PO_4R^4R^5$, —$PO_3R^4R^5$, —$NR^6$—CO—$NR^4R^5$, —O—$COOR^6$, —$NR^4$—$COOR^5$, —$NR^4$—CO—$R^5$ or a phosphoramidate group; $R^3$ is an optionally substituted alkyl, alkenyl, alkynyl, aryl, alkaryl, aralkyl or heteroaryl group; $R^4$, $R^5$ and $R^6$ independently are hydrogen or one of the groups as defined for $R^3$, or wherein two groups selected from the group consisting of $R^4$, $R^5$ and $R^6$ together comprise the atoms necessary to form a ring; and $V^2$ and $V^3$ independently are hydrogen or one of the groups as defined for $R^3$; and $V^4$ is hydrogen or one of the groups as defined for $R^3$; or wherein two groups, selected from $V^1$ to $V^3$, together comprise the atoms necessary to form a ring.

9. A lithographic printing plate precursor comprising a support which includes a hydrophilic surface or which is provided with a hydrophilic layer and a coating thereon, said coating comprising an IR absorbing agent, a contrast enhancing compound and a polymeric binder that alters its solubility in an alkaline developing solution upon exposure, wherein said contrast enhancing compound has the structure of formula I (I)

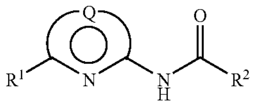

wherein in formula I $R^1$ is hydrogen, an optionally substituted alkyl, alkenyl, alkynyl, aryl, alkaryl, aralkyl or heteroaryl group, halogen, —$NR^4R^5$, —CO—$NR^4R^5$, —$SO_2$—$NR^4R^5$, —$COR^6$, —CN, —$NO_2$, —$COOR^6$, —$OR^3$, —$SR^3$, —$SOR^3$, —$SO_2R^6$, —$SO_3R^6$, —$PO_4R^4R^5$, —$PO_3R^4R^5$, —$NR^6$—CO—$NR^4R^5$, —O—$COOR^6$, —$NR^4$—$COOR^5$, —$NR^4$—CO—$R^5$ or a phosphoramidate group;

$R^2$ is hydrogen, an optionally substituted alkyl, alkenyl, alkynyl, aryl, alkaryl, aralkyl or heteroaryl group, halogen, —$SO_2$—$NR^4R^5$, —CN, —$NO_2$, —$SOR^3$, —$SO_2R^6$, —$SO_3R^6$, —$PO_4R^4R^5$, —$PO_3R^4R^5$ or a phosphoramidate group;

$R^3$ is an optionally substituted alkyl, alkenyl, alkynyl, aryl, alkaryl, aralkyl or heteroaryl group;

$R^4$, $R^5$ and $R^6$ independently are hydrogen or one of the groups as defined for $R^3$, or wherein two groups selected from the group consisting of $R^4$, $R^5$ and $R^6$ together comprise the atoms necessary to form a ring;

Q is one of the following groups which forms an optionally substituted 6 membered heteroaromatic ring, said groups being selected from the group consisting of **—C($T^2$)—N—N—*, **—N—N—C($T^2$)-*, **—N—C($T^2$)-C($T^3$)-*, **—C($T^2$)-N—C($T^3$)-*, **—C($T^2$)-C($T^3$)-C($T^4$)-*, **—C($T^2$)-C($T^1$)-N—*, **—N—C($T^1$)-N—* and **—N—N—N—*, or Q is one of the following groups which forms an optionally substituted 5 membered heteroaromatic ring, said groups being selected from the group consisting of **—C($T^1$)-N($T^2$)-*, **—C($T^2$)-S—*, **—C($T^2$)-O—*, **—N—N($T^2$)-*, **—N—S—*, **—N—O—*, **—N($T^2$)-C($T^3$)-*, **—S—N—* and **—O—N—*, wherein

* indicates a binding site to the carbon atom between the two nitrogen atoms and ** indicates a binding site to the carbon atom substituted by $R^1$; and wherein the symbol "O" in the middle of the ring comprising Q represents the pi-electrons necessary for the aromatic ring;

$T^1$ is one of the groups as defined for $R^1$;

$T^2$, $T^3$ and $T^4$ independently are one of the groups as defined for $R^2$; or wherein one of the groups of $T^1$, $T^2$, $T^3$ or $T^4$ together with one of the groups of $R^1$ comprise the atoms necessary to form a ring; or wherein one of the groups of $T^1$, $T^2$, $T^3$ or $T^4$ together with one of the groups of $R^2$ comprise the atoms necessary to form a ring; or wherein two groups, selected from $T^1$, $T^2$, $T^3$ or $T^4$, comprise the atoms necessary to form a ring, and wherein the contrast enhancing compound is linked to a polymer by a chemical bond formed between at least one atom of a group selected from the group consisting of $R^1$, $R^2$ and $T^1$ to $T^4$, and at least one atom of said polymer.

10. The lithographic printing plate precursor according to claim 9, wherein said contrast enhancing compound is chemically bound to a side chain of said polymer and wherein said chemical bond is formed between at least one atom of a group selected from the group consisting of $R^1$, $R^2$ and $T^1$ to $T^4$ and at least one atom of the side chain of said polymer, optionally by a linking group L between said side chain and said contrast enhancing compound.

* * * * *